United States Patent [19]

Edberg et al.

[11] Patent Number: 5,793,381
[45] Date of Patent: Aug. 11, 1998

[54] UNICODE CONVERTER

[75] Inventors: Peter K. Edberg, Eugene, Oreg.; John L. McConnell, Menlo Park, Calif.; Yung-Fong Frank Tang, Sunnyvale, Calif.; Andrew M. Daniels, Menlo Park, Calif.

[73] Assignee: Apple Computer, Inc., Cupertino, Calif.

[21] Appl. No.: 527,438

[22] Filed: Sep. 13, 1995

[51] Int. Cl.[6] .................................................. G06F 7/00
[52] U.S. Cl. .............................. 345/467; 704/8; 707/542
[58] Field of Search ............................ 395/758, 899; 345/467; 704/8; 707/529, 542

[56] References Cited

U.S. PATENT DOCUMENTS 5,091,950  2/1992  Ahmed .
5,170,445  12/1992  Nelson et al. .
5,477,451  12/1995  Brown et al. .

OTHER PUBLICATIONS

Trans–European Research and Education Networking Association (TERENA), "Alpha Test Release of the C3 System for Coded Character Set Conversion", Dec. 15, 1994, pp. 1–3.

Bauwens et al., "Standardization as a Prerequisite for Accessibility of Electronic Text Information for Persons Who Cannot Use Printed Material", *Transactions on Rehabilitation Engineering*, IEEE, vol. 3, iss. 1, pp. 84–89, Mar. 1995.

Unicode Consortium "The Unicode Standard", Version 1.0, vol. 1, 1991.

Becker, Joseph D. "Multilingual Word Processing", vol. 251, Issue #1 Scientific American, Jul. 1984, USA.

Peter Edberg, "Background information–mapping tables for Mac™ OS", Apr. 15, 1995, (Internet posting at FTP:// Unicode.org/pub/Mapping Tables/Apple).

Apple Computer, Inc., "Inside Macintosh, vol. VI," pp. 1–21 to 1–22 (World Development).

Nadine Kano, "Yes, Virginia, Windows 95 Does Do Unicode!" Creating Unicode Apps for Windows 95, Microsoft Developer Network News, Jul./Aug. 1995.

*Primary Examiner*—William M. Treat
*Attorney, Agent, or Firm*—Beyer & Weaver, LLP

[57] ABSTRACT

A character code conversion system that provides round trip fidelity, while ensuring that the resulting character codes are interchangeable with other platforms. The code conversion system is able to map a single source character or a sequence of characters to either a single target character or a sequence of target characters. With round trip fidelity, source text can be converted to target text and then back again to the original source text. The interchangability is ensured by maximizing the use of standard target characters, and by minimizing the use of private characters. The code conversion is particularly useful for converting to/from Unicode characters from/to other character sets.

31 Claims, 28 Drawing Sheets

| STATE | OS | NS | DD | HD | JL(f) | JV(f) | JT | LD | PS | CC | ISS | ASS | NU |
|---|---|---|---|---|---|---|---|---|---|---|---|---|---|
| 0 = END | END →0 | END →0 | END →0 | END →0 | END →0 | END →0 | END →0 | END →0 | END →0 | END →0 | END →0 | END →0 | END →0 |
| 1 = START | AdvMark →2 | AdvMarkS →2 | AdvMarkS →2 | AdvMarkS →2 | AdvMarkS →7 | AdvMark →2 | AdvMark →2 | AdvMark →3 | AdvMarkS →2 | AdvMark →0 | AdvMarkS →0 | AdvMarksASS Error →0 | |
| 2 = TE NS | END →0 | AdvMarkS →2 | AdvMarkS →2 | AdvMarkS →2 | END →0 | END →0 | END →0 | END →0 | END →0 | END →0 | END →0 | END →0 | END →0 |
| 3 = LD | END →0 | AdvMarkS →2 | END →0 | END →0 | END →0 | END →0 | END →0 | Adv →4 | Adv →5 | END →0 | END →0 | END →0 | END →0 |
| 4 = LD LD+ | END →0 | END →0 | END →0 | END →0 | END →0 | END →0 | END →0 | Adv →4 | Adv →5 | END →0 | END →0 | END →0 | END →0 |
| 5 = LD+PS | END →0 | END →0 | END →0 | END →0 | END →0 | END →0 | END →0 | AdvMark →6 | END →0 | END →0 | END →0 | END →0 | END →0 |
| 6 = LD+ FSLD+ | END →2 | AdvMarkS →2 | AdvMarkS →2 | AdvMarkS →2 | END →0 | END →0 | END →0 | AdvMark →6 | END →0 | END →0 | END →0 | END →0 | END →0 |
| 7 = JL+ | END →0 | AdvMarkS →2 | END →0 | END →0 | AdvMark →7 | AdvMark →8 | END →0 | END →0 | END →0 | END →0 | END →0 | END →0 | END →0 |
| 8 = JL+JV+ | END →0 | AdvMarkS →2 | END →0 | END →0 | END →0 | AdvMark →8 | AdvMark →9 | END →0 | END →0 | END →0 | END →0 | END →0 | END →0 |
| 9 = JL+JV+JT+ | END →0 | AdvMarkS →2 | END →0 | END →0 | END →0 | END →0 | AdvMark →9 | END →0 | END →0 | END →0 | END →0 | END →0 | END →0 |

UNICODE CONVERTER

BACKGROUND OF THE INVENTION

1. Field of the Invention

The present invention relates to a system for converting between character codes for written or displayed text, and more particularly, to a code converter for converting between one character set and another character set.

2. Description of the Related Art

Computers and other electronic devices typically use text to interact with users. The text is usually displayed on a monitor or some other type of display device. Because the text must be represented in digital form inside the computer or other electronic device, a character set encoding must be used. Generally speaking, a character set encoding operates to encode each character of the character set with a unique digital representation. The characters (which are encoded) correspond to letters, numbers and various text symbols are assigned numeric codes for use by computers or other electronic devices. The most popular character set for use with computers and other electronic devices is the American Standard Code for Information Exchange (ASCII). ASCII uses 7-bit sequences for its encodings. In other countries, different character sets are used. In Europe, the dominant character encoding standards are the ISO 8859-X family, especially ISO 8859-1 (called "Latin-1") developed by the International Standards Organization (ISO). In Japan, the dominant character encoding standard is JIS X0208 where JIS refers to the Japanese Information Standard and was developed by Japan Standards Association (JSA). Examples of other existing character sets include Mac™ OS Standard Roman encoding (by Apple Computer, Inc.), Shift-JIS (Japan), Big5 (Taiwan), and many more.

With the ongoing globalization of business and networks, it has become important for computers or other electronic devices to be able to handle multiple character encodings. For example, the same computer or electronic device may be used by persons of different nationalities who wish to interact with the computer or other electronic device in a different language. For each such language a different character set encoding is usually needed. However, character sets for the same language can also differ.

There is also a need to be able to convert from one character set encoding to another encoding. For example, a user in France using ISO 8859-1 may want to send an electronic mail message in French to a user in Israel who is using ISO 8859-8. Because the sender and receiver are using different character set encodings, the non-ASCII characters in the message will be garbled for the user in Israel. Ideally, one of the computers or electronic devices would convert from one character set to another character set. This has been achieved to a limited extent between a few character sets, but is largely not possible with modern computers or electronic devices. Code conversion is made difficult because of the numerous different character standards and the often conflicting or inconsistent national standards.

The Unicode™ standard (hereafter simply Unicode or Unicode standard) was developed to provide an international character encoding standard. The designers of the Unicode standard wanted and did provide a more efficient and flexible method of character identification. The Unicode standard includes characters of all major International Standards approved and published before Dec. 31, 1990, as well as other characters not in previous standards. The characters are encoded in the Unicode standard without duplication. The codes within the Unicode standard are 16-bits (or 2 bytes) wide.

A character code standard such as the Unicode standard facilitates code conversion and enables the implementation of useful processes operating on textual data. For example, in accordance with the above example, the computer or other electronic device in France can transmit Unicode characters and the computer or other electronic device in Israel can convert the Unicode characters it receives into a Hebrew based character set that is compatible with the computer or other electronic device in Israel.

Below is a general overview discussion of the Unicode standard. For additional detail about the Unicode standard, see, e.g., The Unicode Standard, Worldwide Character Encoding, Version 1.0, Addision-Wesley 1991 (Version 1.1 is also available for additional details), both versions of which are hereby incorporated by reference in their entirety.

The design of the Unicode encoding scheme is independent of the design of basic text processing algorithms, with the exception of directionality. Unicode implementations are assumed to contain suitable text processing and/or rendering algorithms. For convenience, all codes in the Unicode standard are grouped by a linguistic and functional category, though all the codes in the Unicode standard are equally accessible. "The code space in the Unicode standard is divided into six zones: General Scripts (alphabetic and other scripts that have relatively small character sets), Symbols, CJK (Chinese, Japanese, and Korean) Auxiliary, CJK ideographs, Private Use and Compatibility. The General Script zone covers alphabetic or syllabic scripts such as Latin, Cyrillic, Greek, Hebrew, Arabic, Devanagari and Thai. The Symbol zone includes a large variety of characters for punctuation, mathematics, chemistry, dingbats, and so on. The CJK Auxiliary zone includes punctuation, symbols, Kana, Bopomofo, and single and composite Hangul. The CJK Ideographic zone provides space for over 20,000 ideographic characters or characters from other scripts. The Private Use zone is used for defining user- or vendor-specific graphic characters. The Compatibility Zone contains characters from widely used corporate and national standards that have other canonical representations in Unicode encoding." The Unicode Standard, supra, Version 1.0, p. 13.

The Unicode standard provides character properties and control characters. Character properties are useful for use in parsing, sorting, and other algorithms requiring semantic knowledge about the code points within the Unicode encoding. The character properties identified by the Unicode standard include: digits, numbers, space characters, non-spacing marks, and direction. The Unicode characters are grouped based on the characters properties. Digits, numbers and space characters are well known. The non-spacing marks group houses non-spacing marks, and the direction group houses the direction characters.

Non-spacing marks (e.g., accent marks in Greek and Roman scripts, vowel marks in Arabic and Devanagari) do not appear linearly in the final rendered text. In a Unicode character code sequence, all such characters follow the base character which they modify, or the character after which they would be articulated in phonetic order (for example, Roman "Á" is stored as "A" when not stored in a precomposed form). When rendered, these characters (i.e., non-spacing marks) are intended to be positioned relative to the preceding base character in some manner, and not themselves occupy a spacing position.

Control characters are encoded in the Unicode standard, but are not themselves graphic characters. These control characters can, for example, be used for indicating a horizontal tab, or supplying additional information about text such as formatting attributes or structure, or for controlling by directional formatting. Because the Unicode standard also provides bidirectional character ordering, the Unicode encoding scheme also includes characters to specify changes in direction. For example, Greek, Roman and Thai have a dominant direction of left-to-right, while Arabic and Hebrew have a dominant direction of right-to-left. The use of control characters to change directions will sometimes be needed by the user or system, for example, when left-to-right characters are to be displayed in right-to-left order.

One problem with conventional code converters is that they are able to convert only one source character to one target character. This type of conversion works for some character sets, but is unsatisfactory for certain character sets (e.g., Unicode) which includes numerous non-spacing characters or combining marks which are normally associated with other characters. The conventional code converters are also incapable of converting to or from symbols, ligatures or ideographs associated with multiple characters.

As a result, convention code converters do not provide round trip fidelity in which the code converters can convert and then unconvert producing the originally input character string. This is important when using the code converter as a hub for the conversion to one character code to another.

Thus, there is a need for a code converter that is able to convert from multiple source characters to a single target character, or to convert a single source character to multiple target characters so as to ensure fidelity in round trip character code conversions.

SUMMARY OF THE INVENTION

Broadly speaking, the invention is a code conversion technique that provides round trip fidelity, while ensuring that the resulting character codes are interchangeable with other platforms. The code conversion system is able to map a single source character or a sequence of characters to either a single target character or a sequence of target characters. With round trip fidelity, source text can be converted to target text and then back again to the original source text. The interchangability is ensured by maximizing the use of standard target characters, and by minimizing the use of private characters. The code conversion is particularly useful for converting to/from Unicode characters from/to other character sets. The mapping of a sequence of Unicode characters to a single character in a target character set has heretofore been unavailable. The invention provides a robust solution which provides a great deal of flexibility in operation as well as in data storage. The invention can be implemented in numerous ways, including as a method, apparatus or system, or on a computer readable medium.

As a method for converting a source string into a target string, an embodiment of the invention performs the operations of: receiving a source string having a first character encoding; sequentially dividing the source string into text elements, each text element including one or more characters of the source string; looking up in a mapping table a conversion code associated with a second character encoding for each of the text elements; and combining the conversion codes for the text elements so as to form a target string of the second character encoding.

Additionally, the mapping table may includes regular mappings and fallback mappings, and the looking up operation may determine the conversion code for each of the text elements using the fallback mappings when the mapping table does not contain a conversion code for the text elements using the regular mappings. Also, it is preferred that each of the characters have a character class associated therewith, and that the dividing of the source string be based at least in part on the character class of the characters within the source string.

As a code conversion system for converting a source string to a target string, an embodiment of the invention includes: a converter for controlling the conversion of the source string having a first character encoding into the target string having a second character encoding; a scanner, for dividing the source string into text elements, each text element including one or more characters of the source string; a mapping table for storing target encodings for text elements of the source encoding; and a lookup handler, for looking up in the mapping table a conversion code associated with a second character encoding for each of the text elements.

The code conversion system may further include a fallback handler and a scanner table. The fallback handler provides fallback conversion codes in certain cases, when the lookup handler is unable to provide a conversion code for one or more text elements. The fallback conversion codes contain one or more code points in the target encoding that are not exactly equivalent to the characters in the text element but have a graphical appearance that is similar. The scanner table assists the scanner in determining whether individual characters in the input string should be included within a current text element or alternatively begin a new next text element.

As a scanning system for scanning an input character string, an embodiment of the invention includes: an input device for obtaining an input character from the input character string, the input character string having a character encoding, and each character of the input character string having a character class; an attributes table for providing attributes for the input character; and a state machine for determining both a next state for the state machine and a next action in accordance with the attributes for the input character and a current state of the state machine. The scanning system determines whether the input character of the input character string should be included within a current text element or whether the current text element should end and a new text element begun based on the next action determined by the state machine. Preferably, the attributes include at least a character class for the input character, and the state machine determines the next state and the next action based on the character class for the input character and the current state of the state machine.

As a computer readable medium containing program instructions for converting a source string into a target string, an embodiment of the invention includes: computer readable code configured to cause a computer to effect receiving a source string having a first character encoding; computer readable code configured to cause a computer to effect dividing the source string into text elements, each text element including one or more characters of the source string; computer readable code configured to cause a computer to effect looking up in a conversion code associated with a second character encoding for each of the text elements; and computer readable code configured to cause a computer to effect combining the conversion codes for the text elements so as to form a target string of the second character encoding.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 14 is a table which represents both a preferred layout and the information which would be stored in the scanner table according to a preferred embodiment of the invention;

DETAILED DESCRIPTION OF THE INVENTION

Embodiments of the invention are discussed below with reference to FIGS. 1–25. However, those skilled in the art will readily appreciate that the detailed description given herein with respect to these figures is for explanatory purposes as the invention extends beyond these limited embodiments.

A code conversion system according to the invention converts source characters to target characters of a different encoding. The invention is a code conversion system that provides round trip fidelity, while ensuring that the resulting character codes are interchangeable with other platforms. The code conversion system is able to map a single source character or a sequence of characters to either a single target character or a sequence of target characters. With round trip fidelity, source text can be converted to target text and then back again to the original source text. The interchangability of the resulting character codes with other platforms is ensured by maximizing the use of standard target characters, and by minimizing the use of private characters. The code conversion system is particularly useful for converting to/from Unicode characters from/to other character sets. The mapping of a sequence of Unicode characters to a single character in a target character set has heretofore been unavailable.

The code conversion system can be a computer system or other electronic device for performing these code conversion operations. This computer system may be specially constructed for the required purposes, or it may be a general purpose computer operating in accordance with a computer program. The processing presented herein is applicable to any computer system or other electronic device. In particular, various general purpose computing machines may be used with software written in accordance with the teachings herein, or it may be more convenient to construct a more specialized electronic device to perform the required operations.

Figure 1:
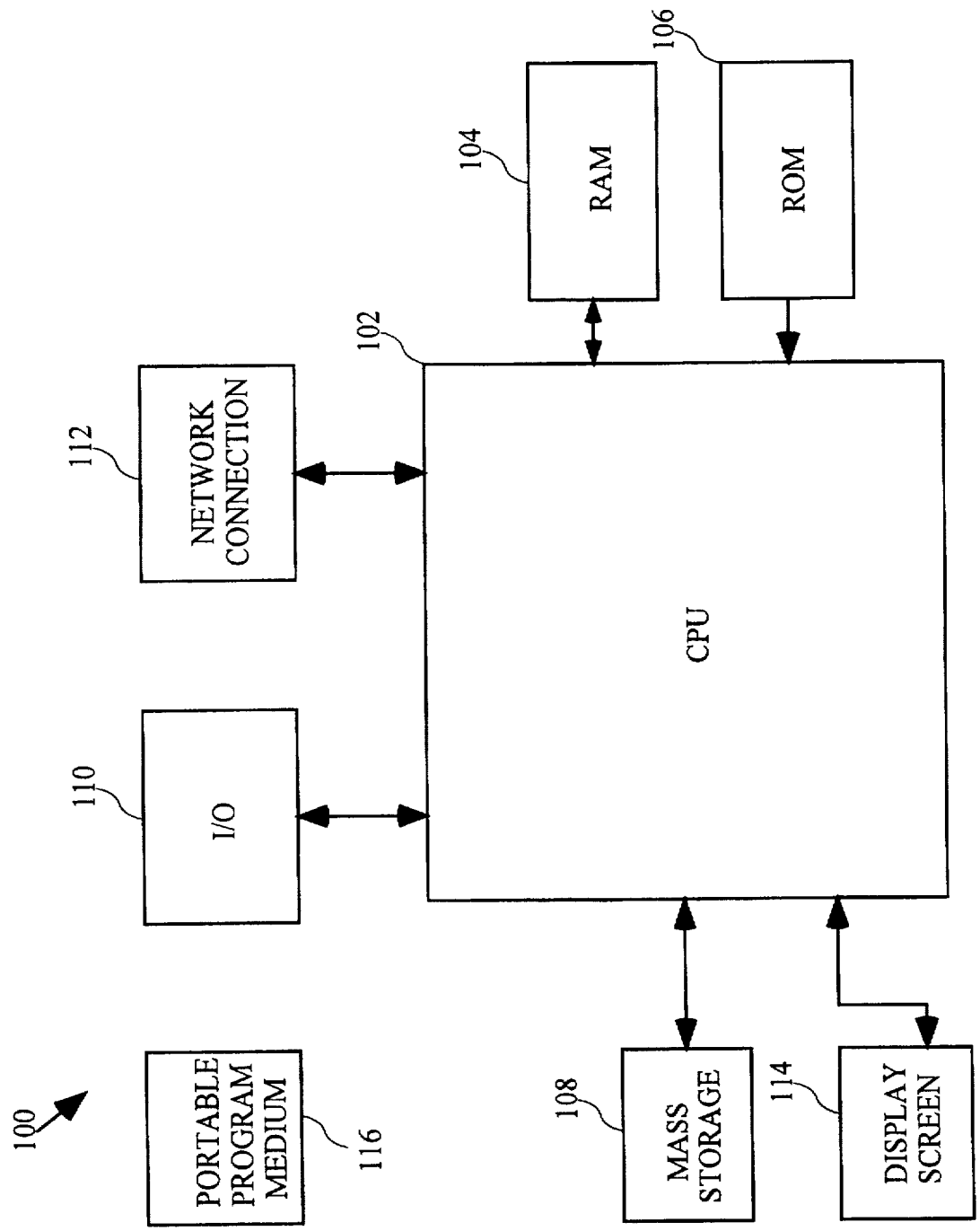
FIG. 1 is block diagram of a representative computer system in accordance with the invention.

FIG. 1 is block diagram of a representative computer system 100 in accordance with the present invention. The computer system 100 includes a central processing unit (CPU) 102, which CPU is coupled bidirectionally with random access memory (RAM) 104 and unidirectionally with read only memory (ROM) 106. Typically RAM 104 includes programming instructions and data, including tables as described herein, in addition to other data and instructions for processes currently operating on CPU 102. The ROM 106 typically includes basic operating instructions, data and objects used by the computer system 100 to perform its functions. In addition, a mass storage device 108, such as a hard disk, CD ROM, magneto-optical (floptical) drive, tape drive or the like, is coupled bidirectionally with CPU 102. Mass storage device 108 generally includes additional programming instructions, data and text objects that typically are not in active use by the CPU, although the address space may be accessed by the CPU, e.g., for virtual memory or the like. Each of the above described computers further includes an input/output source 110 that typically includes input media such as a keyboard, pointer devices (e.g., a mouse or stylus) and the like. The computer system 100 can also include a network connection 112 over which data and instructions can be transferred.

Additional mass storage devices (not shown) may also be connected to CPU 102 through network connection 112. The computer system 100 further includes a display screen 114 for viewing text and images generated or displayed by the computer system 100.

The CPU 102 together with an operating system (not shown) operate to execute computer code. The computer code may reside on the RAM 104, the ROM 106, or a mass storage device 108. The computer code could also reside on a portable program medium 116 and then be loaded or installed onto the computer system 100 when needed. Portable program mediums 116 include, for example, CD-ROMS, PC Card devices, RAM devices, floppy disk, magnetic tape.

I. Definitions

1. Code Point: A code point is a bit pattern in a particular encoding. Usually the bit pattern is one or more bytes long. A Unicode code point is always 16 bits or two bytes.

2. Encoding: An encoding is a one-to-one mapping between a set of characters and a set of code points. For example, the ASCII encoding maps a set including a–z, A–Z, and 0–9 to the code points x00 through x7F.

3. Text Element: A text element is a sequence of one or more code points that are treated as a unit for a particular operation. For example, LATIN CAPITAL LETTER U followed by NON-SPACING DIAERESIS is a text element (e.g., two adjacent characters in this example) for the code conversion operation in accordance with the invention.

4. Glyphs: A displayed form that provides the visual representation of a character. For example an italic "a" and a roman "a" are two different glyphs representing the same underlying character.

5. Presentation Form: A presentation form is a glyph that varies its visual form depending on the context. Some encodings map only abstract characters, which are independent of context, while other encodings map only presentation forms. For example, a ligature such as "fi" is a presentation form for the character sequence LATIN CAPITAL LETTER F followed by LATIN CAPITAL LETTER I.

6. Fallback: A fallback is a sequence of one or more code points in the target encoding that are not exactly equivalent to the source code points but which preserve some of the information of the original. For example, (C) is a possible fallback for ⓒ.

7. Default: A default is a sequence of one or more code points in the target encoding that are used when nothing in the target encoding even resembles the source code points.

II. Unicode Converter

The general conversion technique according to the invention converts source characters to target characters of a different encoding. Preferably, either the source characters or the target characters are Unicode characters.

Figure 2:
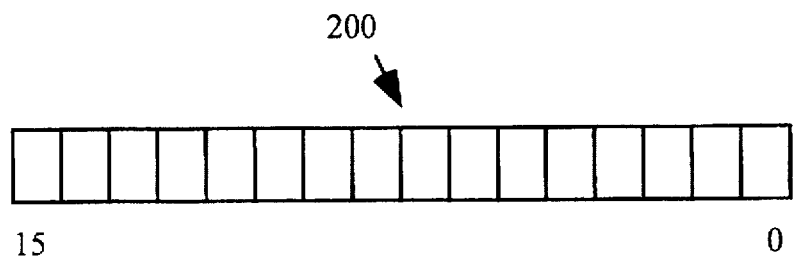
FIG. 2 illustrates the format of Unicode character encodings.

The Unicode standard is a compilation of character encodings developed into a single, universal, international character encoding standard. FIG. 2 illustrates the format of the Unicode character encodings. Specifically, the Unicode standard provides for codes which are 16 bits wide as illustrated by a format 200 shown in FIG. 2. Within this document, Unicode characters are represented in hexadecimal with a preceding u (e.g., u0041), and characters in other encodings are represented in hexadecimal with a preceding x (e.g., x41 for a 1-byte character, x8140 for a 2-byte character).

Figure 3:
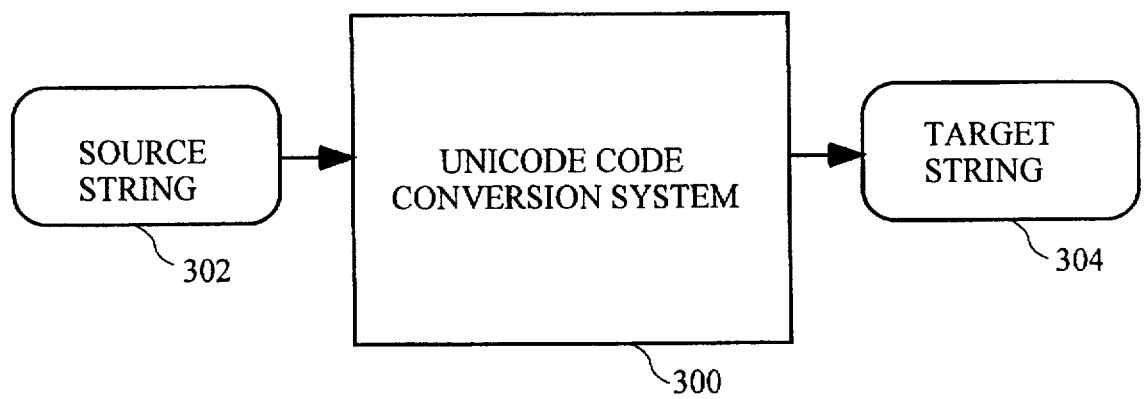
FIG. 3 illustrates a block diagram of a basic Unicode code conversion system according to the invention which receives a source string and outputs a target string.

FIG. 3 illustrates a block diagram of a basic Unicode code conversion system 300 according to the invention which receives a source string 302 and outputs a target string 304. The Unicode code conversion system 300 operates to convert characters of the source string 302 into one or more characters in the target stream which are of a different character encoding than the encoding utilized in the source string. Preferably, the Unicode code conversion system 300 converts from Unicode to a different target encoding (From-Unicode) or converts from a different source encoding (To-Unicode).

Figure 4:
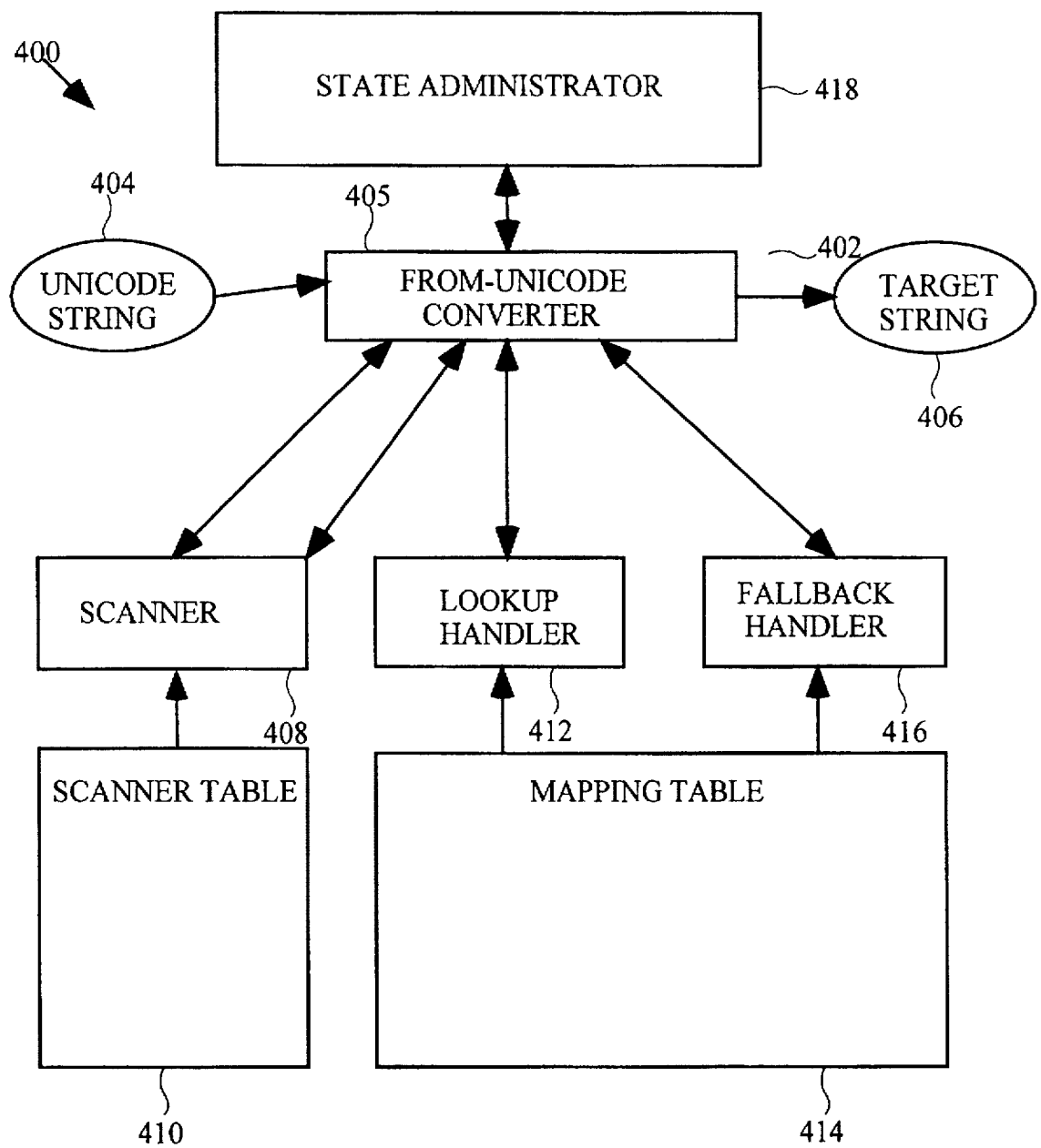
FIG. 4 illustrates a block diagram of an embodiment of a From-Unicode code conversion system according to an embodiment of the invention.

FIG. 4 illustrates a block diagram of an embodiment of a Unicode code conversion system 400 according to the invention. A Unicode code conversion system 400 includes a From-Unicode converter 402 which receives a Unicode string 404 and produces a target string 406. The From-Unicode converter 402 performs the code conversion process in accordance with the invention. In so doing, the From-Unicode converter 402 interacts with a scanner 408. The scanner 408 in conjunction with a scanner table 410 scans the Unicode string 404 to identify a text element. The From-Unicode converter 402 then uses a lookup handler 412 to look up the one or more characters in target encoding for the text element identified by the scanner 408. The lookup handler 412 uses a mapping table 414 to obtain the one or more characters in the target encoding for the text element. Additionally, the From-Unicode converter 402 may also use a fallback handler 416. The fallback handler 416 operates together with the mapping table 414 to identify one or more characters in the target encoding that are able to be used as a fallback mapping for the text element in cases where the look-up handler 412 has been unable to identify one or more characters in the target encoding for the text element. A state administrator 418 maintains or stores information on the current state of the conversion. This information may, for example, include context, direction and state of symmetric swapping.

A. Scanner and Scanner Table

The scanner 408 in conjunction with the scanner table 410 scans the Unicode string 404 string and returns the next text element and any additional information needed by the look-up handler 412. The additional information includes one or more of direction information, context information, and various state indicators. The general operation of the scanner 408 is as follows. The scanner 408 scans through the characters of the input Unicode string 404. If direction information is needed for the target encoding, then the character direction is obtained for each character in the text element. Also, if character context information is needed for the target encoding, then character context information is obtained for each character in the text element. Then, as the scanner 408 scans through each of the characters, the scanner 408 takes an action for the character in accordance with information residing in the scanner table 410. The particular action that the scanner 408 takes is determined based on state and character class. The actions that the scanner 408 can take include: marking the current character, setting or clearing the symmetric swapping bit, noting the contextual form of a text element, setting a flag that indicates that the text element will need reordering, and indicating end of the text element. The symmetric swapping bit, the context and the direction are saved by the state administrator 418 as information pertaining to the state of the scanner. Before returning, the scanner 408 saves context information for the text element. The scanner 408 returns the text element (each text element within the input string) and its attributes. The attributes include the following: direction, class, priority, symmetric swapping state, subset and context. After the scanner 408 determines a text element, then the characters may need to be reordered into canonical order. As an example, reordering of the characters within a text element is done when the text element includes non-spacing marks that are not in canonical order as defined by Unicode.

Preferably, the scanner 408 together with the scanner table 410 are implemented as a pair of state machines that operate in parallel. A first state machine resolves the character direction, and a second state machine computes text elements and character form context information where applicable and also maintains the symmetric swapping state. By using two separate state machines, the Unicode code conversion system 400 is easier to design and maintain. The first and second state machines can be implemented as two-dimensional arrays (or tables) indexed by state and class. In cases where the action the scanner 408 is to take depends on the character direction, then the state machine entry is an index into another table which contains the appropriate action for the scanner 408 to take for each direction.

The function of the scanner 408 is to convert the input Unicode string 404 into text elements and to return the text elements and their attributes. The scanner 408 needs to save certain characteristics of the text element so that it can be properly converted in the target encoding. Namely, the characteristics include the direction, the context and the symmetric swapping state. However, the scanner 408 need not know what the target encoding is because its operation is independent of the particular target encoding. Nevertheless, the Unicode conversion system 400 is preferably implemented such that the definition of a text element (i.e., the chunking behavior) could vary with the target encoding simply by modifying the scanner table 410.

The directionality of characters is used for presentation of the characters. For example, when Arabic or Hebrew are displayed on a display screen, they are ordered from right-to-left. Most Unicode characters have an implicit direction, see Unicode Version 1.0, at p. 407 (Section 4.6) and p. 611 (Appendix A). The implicit direction classes provided with the Unicode standard and their values include: Left-Right (0), Right-Left (1), European Number (2), European Number Separator (3), European Number Terminator (4), Arabic Number (5), Common Number Separator (6), Block Separator (7), Segment Separator (8), Whitespace (9), and Other Neutrals (10). The scanner 408 looks up the direction class for characters of the text element. The direction class is then used to resolve the direction of the text element. There are also special Unicode characters which cause overriding or embedding of directionality. These special direction Unicode characters are treated by the scanner 408 as single character text elements.

There are some basic rules that the scanner 408 follows in forming the text elements. The base rule is that if none of the rules apply, then the text element is a single Unicode character. Another rule is that non-spacing or combining marks following a base character are grouped with the base character as a single text element. Yet another rule is that characters associated with symbols (e.g., Korean Hangul Jamos characters), ligatures or ideographs are encountered, they are combined into text elements. Still another rule is that when a fraction slash is surrounded on each side by a sequence of one or more decimal digits, they are combined as a numeric fraction text element.

The rule for non-spacing or combining marks is now explained in greater detail. According to the Unicode standard, non-spacing marks follow the base character. Hence, the non-spacing marks that follow a base character become part of the text element that includes the base character. See, The Unicode Standard, Version 1.0, at p. 403 (Section 4.5). For example, when a single, non-spacing character is followed by a character that is not a non-spacing character, then the non-spacing character is combined with the previous character as a text element. The length of the text element is then two and the attributes for the text element are defined by the base character. If there is no preceding character, the non-spacing character is just passed on as a single text element. Multiple non-spacing characters can also be combined in this manner.

The rule for Korean Hangul Jamos characters is now explained in greater detail. Each Hangul character has an implicit value which is of one of the classes: Choseong (initial), Jungseong (medial) or Jongseong (final). The Unicode Standard, Version 1.1, (Section 5), lists the codes and the permitted combinations for these characters. The scanner 408 will group the Korean Jamos characters according to the permitted combinations of these characters. For input combinations which are not permitted, the scanner 408 will return the character as a single text element. As before, when a Hangul syllable is followed by a combining mark, the combining mark is included within the text element for the Hangul syllable.

The rule for numeric fractions is now explained in greater detail. The scanner 408 initially treats each character of fraction slash numbers as if they were single character text elements. However, when a complete fraction slash sequence is encountered, the scanner 408 will join the characters associated with the sequence into a single text element. If a digit is encountered with a combining mark, the digit and the combining mark cannot be part of a fraction slash, but the digit and the combining mark can together form a text element.

Except for non-spacing characters, all Arabic characters are passed through the scanner 408 as single text elements. The Arabic form shaping state characters are also passed through the scanner as single text elements. The directional formatting codes are passed through the scanner 408 as single text elements.

B. Lookup Handler, Mapping Tables and Fallback Handler

The mapping table 414 is used by the lookup handler 412 to match an input sequence of one or more Unicode characters to an output sequence of one or more characters in the target encoding. In addition to the Unicode sequence (i.e., text element) itself, certain additional pieces of information about the input sequence are available (e.g., direction, context, symmetric swapping state, vertical forms request, fallback request, tolerance, variant), and some tables make use of this information. Preferably, the mapping table 414 also stores data needed by the fallback handler 416, though a separate table could be provided for use by the fallback handler 416.

Figure 5:
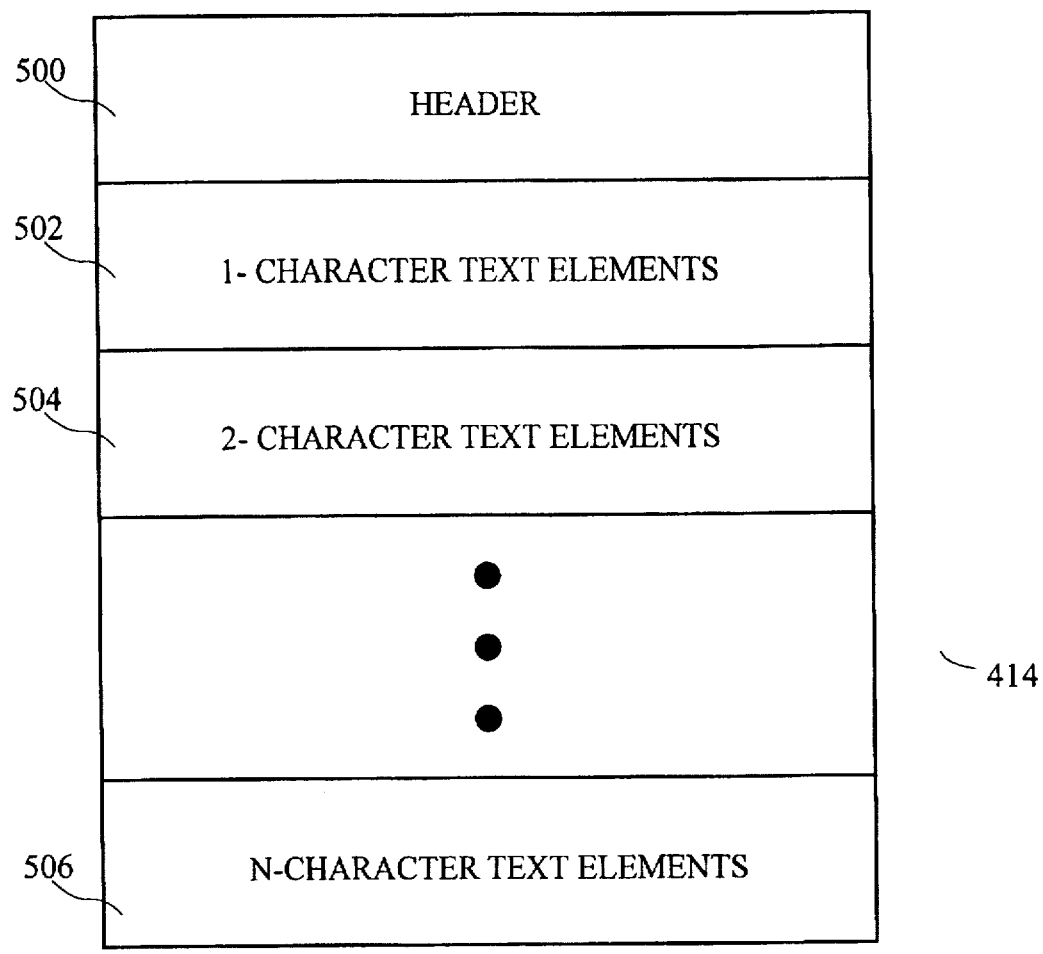
FIG. 5 is a schematic diagram of a preferred arrangement for a mapping table of the Unicode code conversion system.

FIG. 5 is a schematic diagram of a preferred arrangement for the mapping table 414 of the Unicode code conversion system 400. The mapping table 414 preferably includes a header portion 500 and then segments of data within the mapping table 414 partitioned based on the number of characters in the text element. The contents of the header portion 500 is discussed in detail below. The mapping table 414 illustrated in FIG. 5 supports encodings for text elements of one to N characters. When the look-up handler 412 searches the mapping table 414 for target encodings for one-character text elements, the segment 502 of the mapping table 414 would be utilized. Similarly, if the text element is two-characters wide, then segment 504 would be used, and if the text element was N characters wide, then segment 506 would be used. Although FIGS. 4 and 5 illustrate a single mapping table 414, the Unicode code conversion system 400 uses a plurality of different mapping tables 414, namely one mapping table for each target character set. Each mapping table includes multiple subtables.

The mapping tables 414 are designed with size and overall conversion speed requirements kept in mind. The mapping tables 414 should be as small as possible without severely degrading lookup time, and the lookup time should be as fast as possible without significantly increasing the table size. The Unicode code conversion system 400 supports multiple table formats so that different formats are possible for each subtable, thereby enabling the speed/size tradeoff to be adjusted for a particular table as needed. Preferably, the design of the mapping table 414 should make the mapping from a single Unicode character to a single character in the target encoding as fast as possible since it is the most common case.

The mapping table 414 design is such that the tables support at least some of the needs of the fallback handler 416, support multiple mapping tolerances, support multiple target character set variants. The table format is also capable of mapping Unicode sequences of one or more characters to an output sequence of zero or more characters. The mapping tables 414 can also specify several possible output sequences for a single input sequence, with the particular output sequence determined by attributes such as direction, context and symmetric swapping state. The mapping tables are also easily extended, so as to facilitate customization of the encoding behavior of the Unicode code conversion system 400.

The information needed by the mapping tables 414 includes the following: the text element from the scanner 408 (i.e., input sequence of characters to convert, with any combining marks in canonical order); whether vertical forms should be used instead of horizontal forms where available; the resolved direction of the text element; the character form context information for the text element (initial, medial, final, or isolated); current state of symmetric swapping (activated or inhibited); information about what level of lookup to be invoked (tolerance level (strict or loose) and fallbacks (on or off)); and an identifier for a particular encoding variant (a variant identifier). The information about the lookup level is provided by a call or an application program which calls the Unicode code conversion system 400. In a language or character set in which direction and context are unimportant, the resolved direction and the context information are not needed.

The definition of variants, the actual mappings from Unicode sequences to target sequences, and the table formats used to access them are alterable by the design of the mapping table 414. Hence, the accuracy and to some extent the performance/size tradeoffs are highly dependent the design of the mapping tables 414. It is preferable that the mapping tables 414 support strict and loose mappings, fallback mappings, and default mappings.

Strict mappings are code conversions in which round trip fidelity is guaranteed. Strict mappings from Unicode to a target character set are the converse of the to Unicode mappings from that character set to Unicode. Loose mappings from Unicode to the target character set are additional mappings that fall within the range of definition or established usage for the characters in the target character set. Loose mappings appear properly mapped but have some ambiguity. For example, in many character sets, a single character may have multiple semantics, either by explicit definition, ambiguous definition, or established usage. For example, the Shift-JIS character x8161 is specified to have two meanings: "double vertical line" and "parallel". Each of these meanings corresponds to a different Unicode character: u2016 "DOUBLE VERTICAL LINE" and u2225 "PARALLEL TO". When mapping from Shift-JIS to Unicode, the code conversion system must choose one of these Unicode characters, say DOUBLE VERTICAL LINE. When mapping from Unicode to Shift-JIS, the code conversion system can—and normally should—map both Unicode characters to the same Shift-JIS character. However, only one of these From-Unicode mappings is the converse of the To-Unicode mapping.

Strict verses Loose Mapping Examples:

If Unicode u000D is strictly mapped to ASCII x0D "carriage return", then Unicode u2029 "PARAGRAPH SEPARATOR" can be loosely mapped to ASCII x0D.

If Unicode u002D "HYPHEN-MINUS" is strictly mapped to ASCII x2D "hyphen-minus", then Unicodes u2010 "HYPHEN" and u2212 "MINUS SIGN" can be loosely mapped to ASCII x2D.

If Unicode u00E0 "LATIN SMALL LETTER A WITH GRAVE" is strictly mapped to ISO 8859-1 xE0 "small letter a with grave accent", then the two-character Unicode sequence u0061+u0300 "LATIN SMALL LETTER A" +"COMBINING GRAVE ACCENT" can be loosely mapped to ISO 8859-1 xE0.

Since Shift-JIS distinguishes halfwidth and fullwidth characters, loose mappings for Shift-JIS must also keep these distinct. Say Unicode uFF40 "FULLWIDTH GRAVE ACCENT" is strictly mapped to Shift-JIS x814D "grave accent [fullwidth]", which is distinct from Shift-JIS x60, "grave accent [halfwidth]". The Unicode sequence u3000+u0300 "IDEOGRAPHIC SPACE" +"COMBINING GRAVE ACCENT" can be loosely mapped to Shift-JIS x814D. However, the Unicode sequence u0020+u0300 "SPACE" +"COMBINING GRAVE ACCENT" should not be loosely mapped to Shift-JIS x814D; instead, it should be loosely mapped to Shift-JIS x60.

Round-trip mapping from Unicode to some other character set and back again is possible when using only Unicode characters for which strict mappings to the other character set exist.

Fallback mappings are mappings from Unicode that do not preserve the meaning or identity of the Unicode character. That is, they map a Unicode character (or sequence of characters) to a character (or sequence) in the target set whose definition or usage does not include the meaning or usage of the Unicode character. Nevertheless, the fallback mapping, when available, provides a character (or sequence) in the target encoding that corresponds closest to the Unicode character (or sequence of characters).

Fallback Mapping Examples:

The Unicode character u0300 "COMBINING GRAVE ACCENT" can be mapped to ASCII x60 "grave accent [spacing]" as a fallback mapping. The difference is that the Unicode character is a combining mark (non-spacing), whereas the ASCII character is a spacing mark.

The Unicode character u01C0 "LATIN LETTER DENTAL CLICK" could be mapped to ASCII x7C "vertical line" as a fallback mapping.

The Unicode character u2001 "EM QUAD" could be mapped to ASCII x20 "space" as a fallback mapping.

Hence, as illustrated in the above examples, fallback mappings are used to generate a target character (or sequence) that is a graphic approximation of the Unicode character (or sequence).

For performance reasons (i.e., the speed with which the encoding can be obtained from the mapping table), there are several possible formats for indexing into the mapping table 414. The possible formats may include a segment format, a list format, a range format, or a chain format. Separate indexes are preferably provided for different length character sequences. As a result, the index associated with each of the segments 502, 504, 506 can be in a different format, and information at the beginning of each index specifies its format. Regardless of format, each index ultimately maps an input sequence either directly to an output sequence, or if the output sequence is long, to an offset that specifies the location of the corresponding output sequence.

The chain format for indexing into the mapping table 414 warrants further discussion. With the chain format, the beginning of the section is checked to determine whether it is a chain header for a chain format table or some other format. The chain format specifies a chain of multiple index tables, each possibly in a different format. If the desired mapping was not found in the first index table, the lookup handler 412 will then check the second, and so on. The chain format is useful, for example, when one index format (which is efficient in space and/or time) can map most but not all of the input sequences, while another less efficient index format can handle the few remaining sequences. Without a chain mechanism, the less-efficient format would have to be used for all of the index sequences. The chain format is also useful when different variants and different tolerance levels require different subtables. Each subtable in the chain has bit flags that can cause it to be excluded or included based on the mapping tolerance and variant currently being handled.

These bit flags associated with each subtable, form a subtable mask. Also, the caller requests (e.g., encoding variant and tolerance) and determined attributes (e.g., resolved direction and context) form a selection mask. The bit assignment within the subtable mask and the selection mask are identical. Hence, the determination of whether or not to include a particular subtable is implemented as a bitwise AND of the subtable mask with the selection mask, and then a comparison of the result with the subtable mask. If the result of the bitwise AND is the same as the subtable mask for the subtable, the subtable is included; otherwise, it is not included.

The header 500 of the mapping table 414 preferably contains:

General identifying information—format, length, checksum, and version.

The minimum target character size (in bytes) (also referred to as charsize).

General flags (for example, whether this lookup table requires direction or context data).

The maximum input sequence length handled by this table, and a list of offset/length pairs specifying the tables that handle input sequence lengths from one through this maximum.

The default fallback character or character sequence for this From-Unicode mapping.

A count and list of variants supported by this table. For each variant, one or more associated bit masks are specified. When there are multiple bit masks for a single variant, attribute information (such as direction, context, and vertical forms request) is used to determine which bit mask is used. Bits set to "1" in a bit mask are used to turn on various subtables to support the different variants.

An additional set of bit masks associated with each of the four possible tolerance settings (strict/loose, fallbacks on/off). The appropriate tolerance level mask is ORed with the variant mask to form the bit mask used to enable or disable subtables.

C. Code Conversion Processing

The processing performed by a preferred embodiment of the Unicode code conversion system 400 is explained in detail below.

Figure 6:
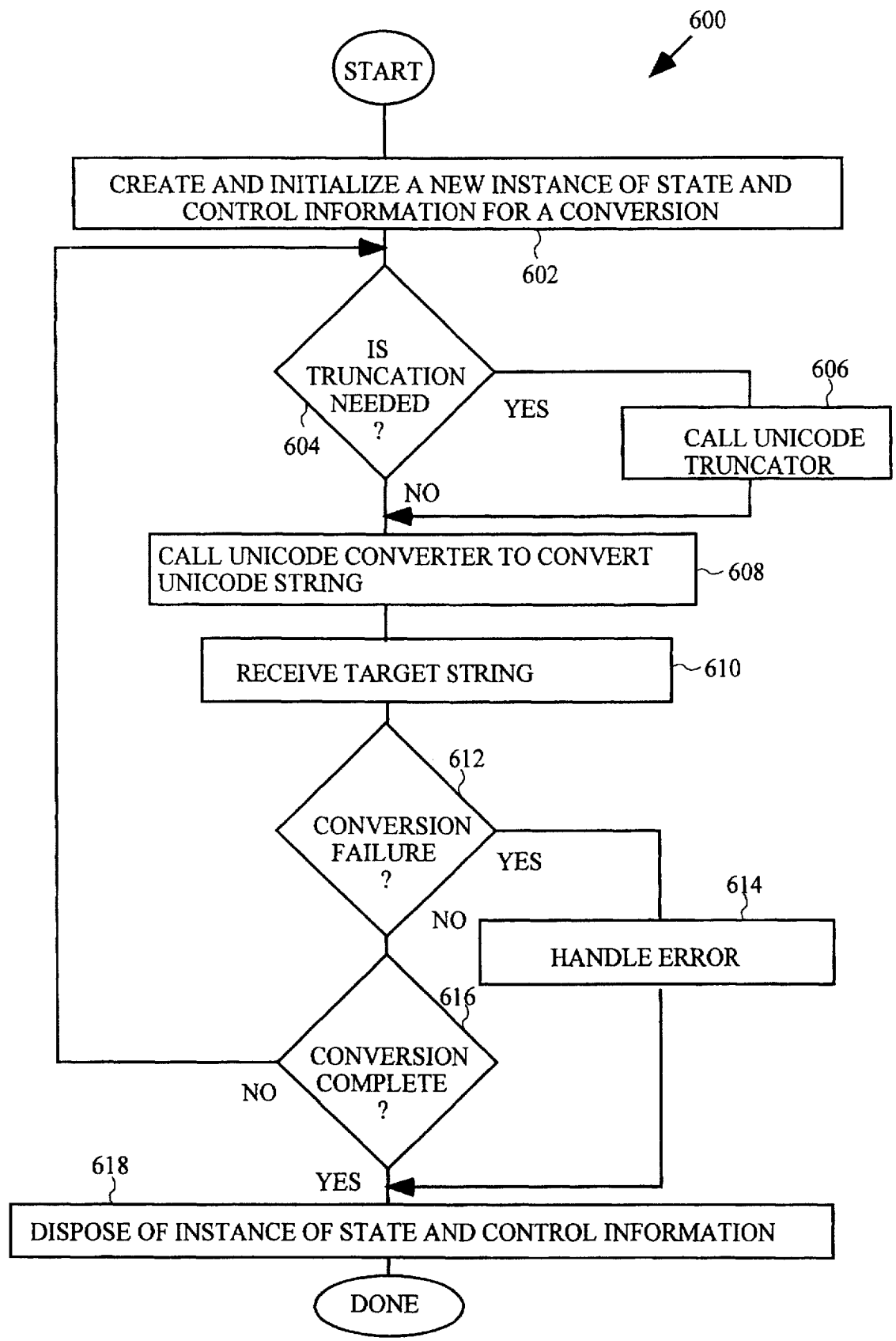
FIG. 6 is a flow chart of processing performed by an application program making use of the Unicode code conversion system according to an embodiment of the invention.

FIG. 6 is a flow chart of processing 600 performed an application (i.e., calling application process or program) making use of the Unicode code conversion system 400. In particular, FIG. 6 concerns From-Unicode processing, but it should be recognized that analogous operations would be performed to convert in the other direction (To-Unicode processing). The From-Unicode converter 402 controls the overall conversion process.

Initially, the processing 600 creates and initializes 602 a new instance of state and control information for a conversion. Because the processing 600 establishes instances, multiple scanning operations can be ongoing and distinguishable by their instance. Next, a decision 604 is made based on whether truncation is needed. In the case where truncation is needed, a Unicode truncator is called 606. Truncation is used when the input data stream exceeds the capacity of the receiving buffer which holds the data for conversion. Additional details on conversion are contained in commonly-assigned U.S. Pat. No. 5,682,158 entitled "CODE CONVERTER WITH TRUNCATION PROCESSING", which is hereby incorporated by reference. In a case where truncation is not needed or following block 608 in the case where truncation is needed, The From-Unicode converter 402 is called 608 to convert the Unicode string 404. The From-Unicode converter 402 function operates to obtain the text element and lookup the target mapping therefor as is discussed in detail below. Once the conversion function returns, the processing 600 receives the target string 406 from the From-Unicode converter 402.

The processing 600 then determines 612 whether there has been a conversion failure. If there has been a conversion failure, then the error is handled 614. On the other hand, if the conversion was successful, then a decision 616 is made based on whether the conversion is complete. The conversion is complete when the characters of the Unicode string 404 have been converted to target encodings. If the conversion is complete, then the processing 600 is complete and the target string 406 is made available to process or application which requested the code conversion. In addition, the processing 600 disposes 618 of the instance of state and control information for a conversion. On the other hand, if decision 616 determines that the conversion is not yet complete, then the processing 600 repeats blocks 604–616 until the conversion is complete or an error results.

Figure 7:
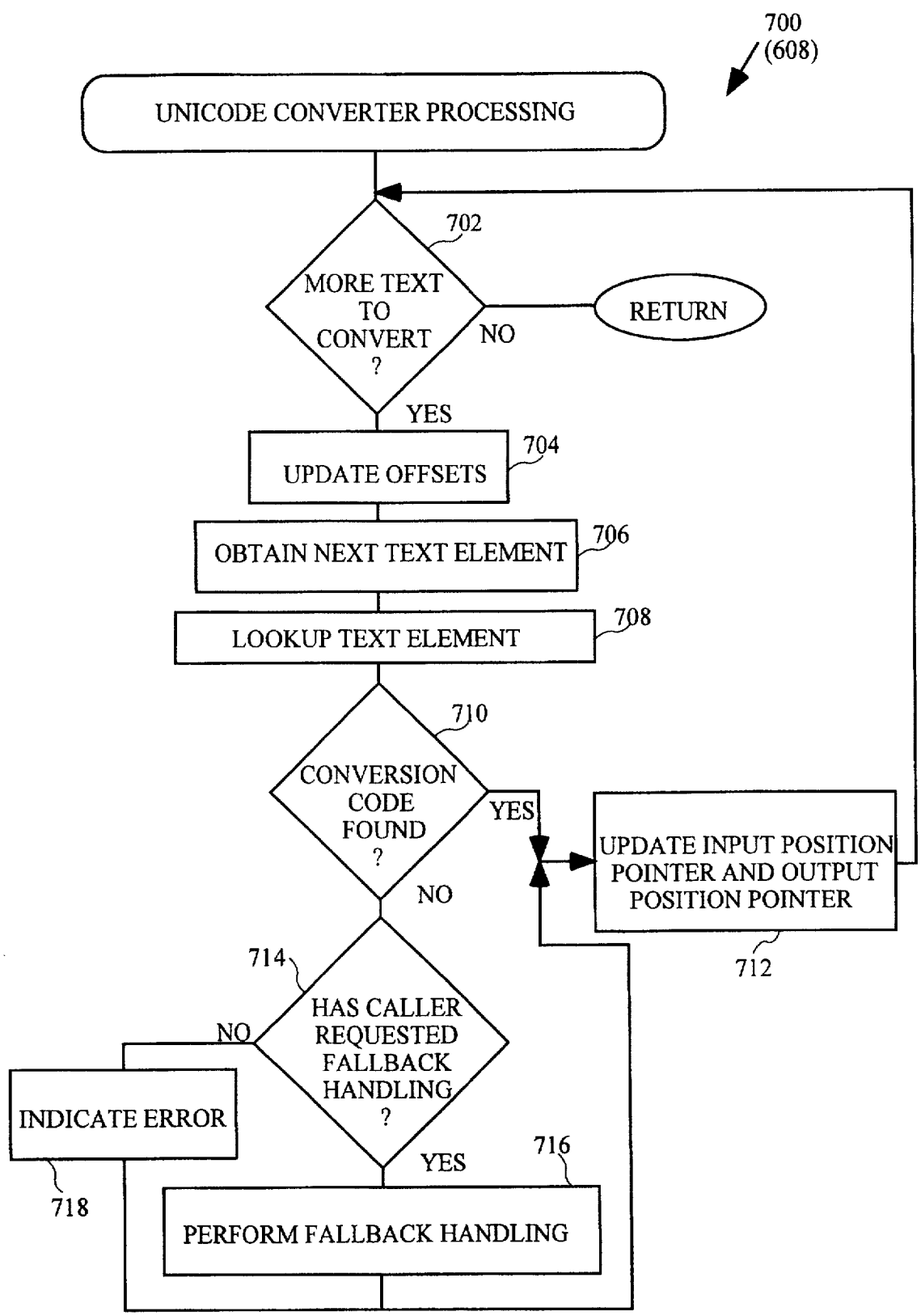
FIG. 7 is a flow chart of Unicode converter processing according to an embodiment of the invention.

FIG. 7 is a flow chart of Unicode converter processing 700. The Unicode converter processing 700 is associated with the operations performed by block 608 in FIG. 6.

The Unicode converter processing 700 begins with a decision 702. The decision 702 determines whether there is text to be converted. If there is no text to be converted, the Unicode converter processing 700 simply returns (or completes). On the other hand, if there is text to be converted (i.e., the Unicode string 404 has not been completely processed), then processing 700 proceeds. First, offsets are updated 704 for an offset array. The offset array is an array of offsets (pointers) associated with an input string that indicate where certain changes such as font changes, line breaks, language changes, etc., occur within the input string 404 that the calling application deems significant. The updating 704 of the offset array involves adjusting the offsets (pointers) for different length characters. For example, the Unicode characters of the input Unicode string 404 are two-bytes long, while the size of the characters associated with a target encoding of ASCII is one-byte long. Here, the updating 704 of the offset array would adjust the offsets so that they point to the corresponding character in the target encoding. In effect, the offsets in the input string are mapped to the output string which has a different encoding. The next text element is then obtained 706. The scanner 408 using the scanner table 410 determines the text elements from the Unicode string 404. The obtaining 706 of the next text element is discussed in detail below. The text element obtained 706 is then looked-up 708 in the mapping table 414 to obtain a conversion code for the text element in the target encoding. The lookup is performed by the lookup handler 412 in conjunction with the mapping table 414. The looking-up 708 of the conversion code is also discussed in detail below.

Next, a decision 710 is made based on whether a conversion code was found for the text element. When a conversion code is found, an input position pointer and an output position pointer for the Unicode string 404 and the target string 406 are, respectfully, updated 712. The input position pointer indicates how much of the input string 404 has been converted. The output position pointer indicates the length of the target string 406. Following block 712, processing 700 returns to the beginning of the Unicode converter processing 700 so that the next text element (if any) of the Unicode string 404 being converted may be processed.

However, in the case when decision 710 determines that no conversion code is found in the mapping table 414, then a decision 714 is made based on whether the caller (i.e., calling application) has requested fallback handling. If the caller has requested fallback handling, then fallback handling is performed 716. The fallback handling is performed by the fallback handler 416 and is discussed in detail below. On the other hand, if the caller has not requested fallback handling, then an error is indicated 718 because the text element could not be converted to the target encoding by the lookup handler 412. Following blocks 716 and 718, the input position pointer and the output position pointer for the Unicode string 404 and the target string 406 are, respectively, updated 702, and then processing returns to the beginning of the Unicode converter processing 700 so that the next text element (if any) of the Unicode string 404 being converted may be processed.

Figure 8:
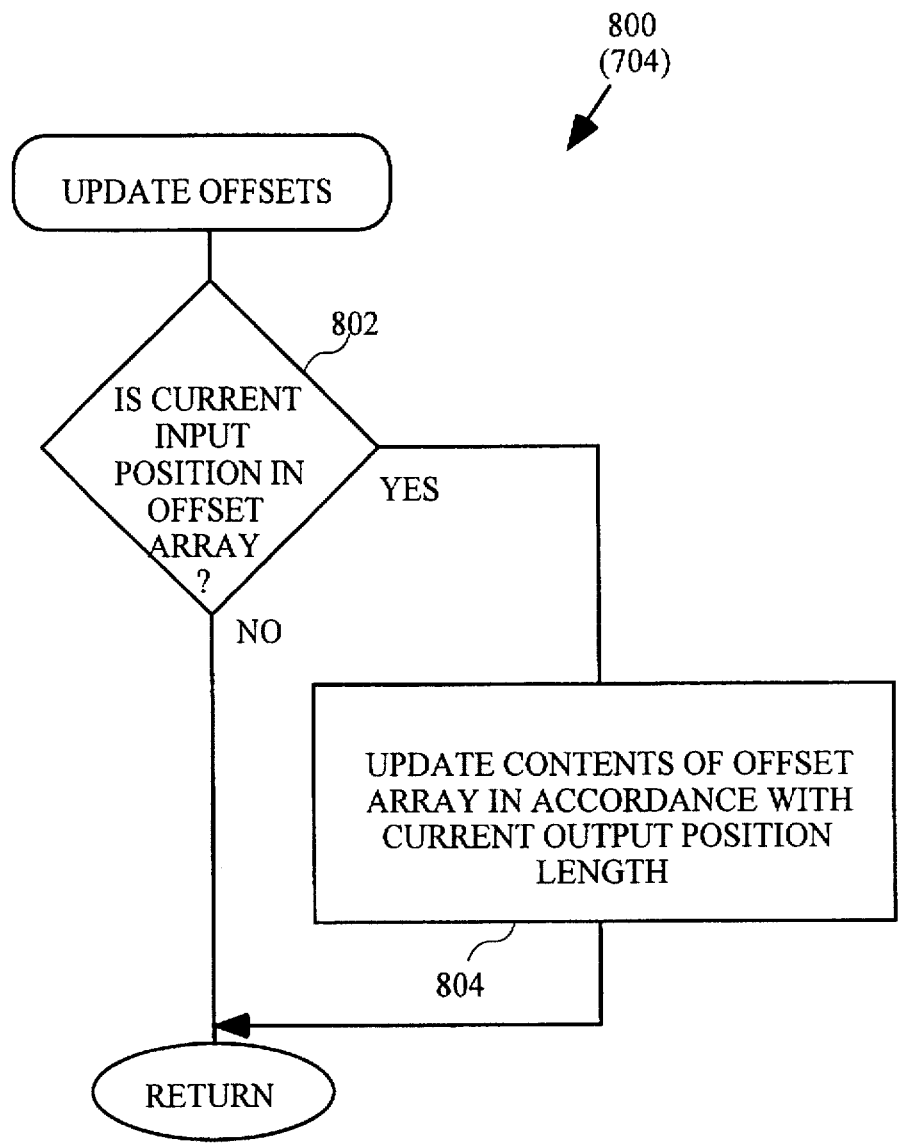
FIG. 8 is a flow chart of update offsets processing according to an embodiment of the invention.

FIG. 8 is a flow chart of update offsets processing 800. The update offsets processing 800 is associated with the block 704 in FIG. 7 in which the offset array is updated.

The update offsets processing 800 begins with a decision 802 based on whether the current input position is in the offset array. If the current input position is in the offset array, then the contents of the offset array are updated 804 in accordance with the current output position length following block 804, the update offsets processing 800 returns. On the other hand, when the current input position is not within the offset array, then decision 802 simply causes the update offsets processing 800 to return because there is no offset to update.

Figure 9A:
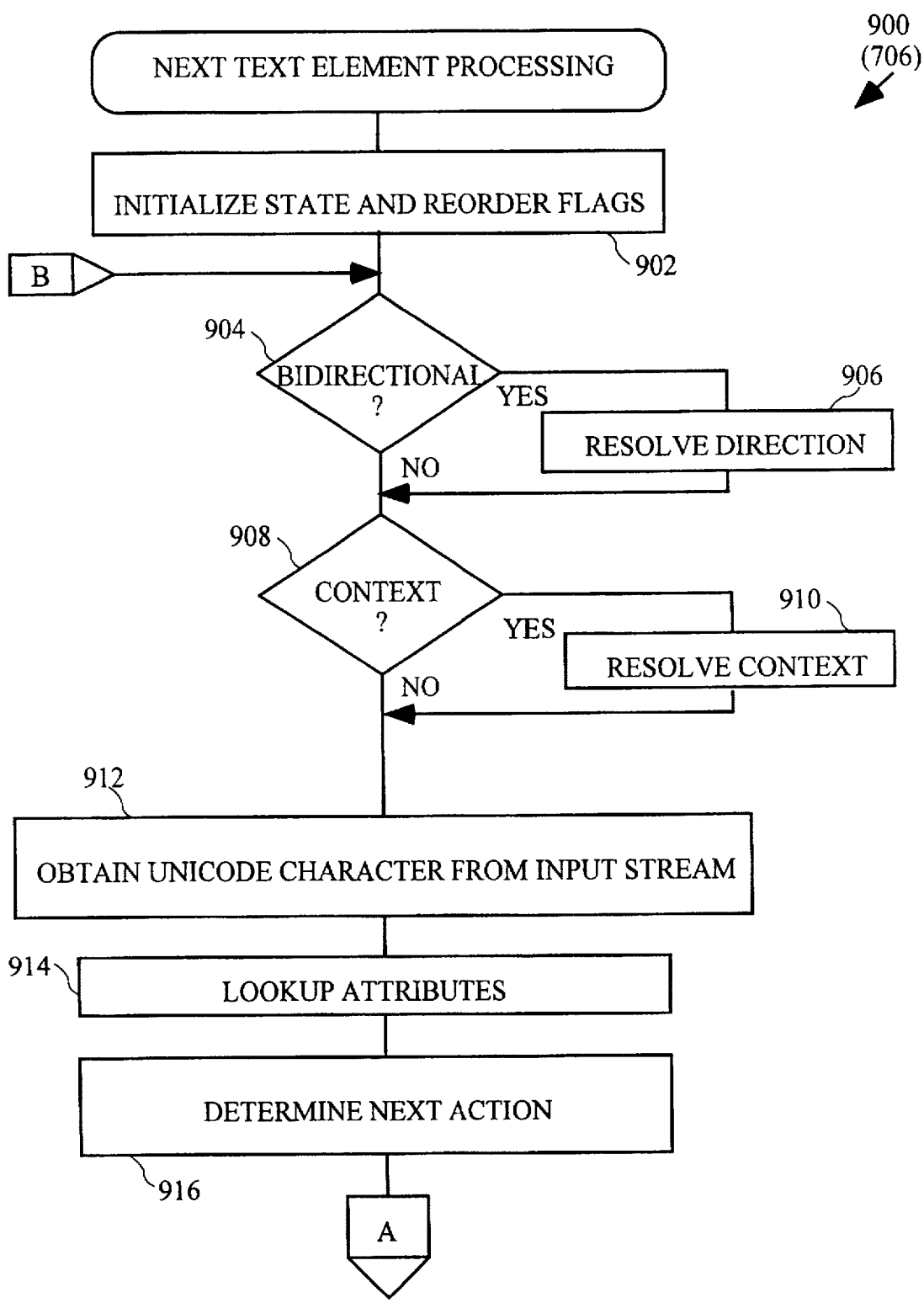
FIGS. 9A and 9B are flow charts of next text element processing according to an embodiment of the invention.
Figure 9B:
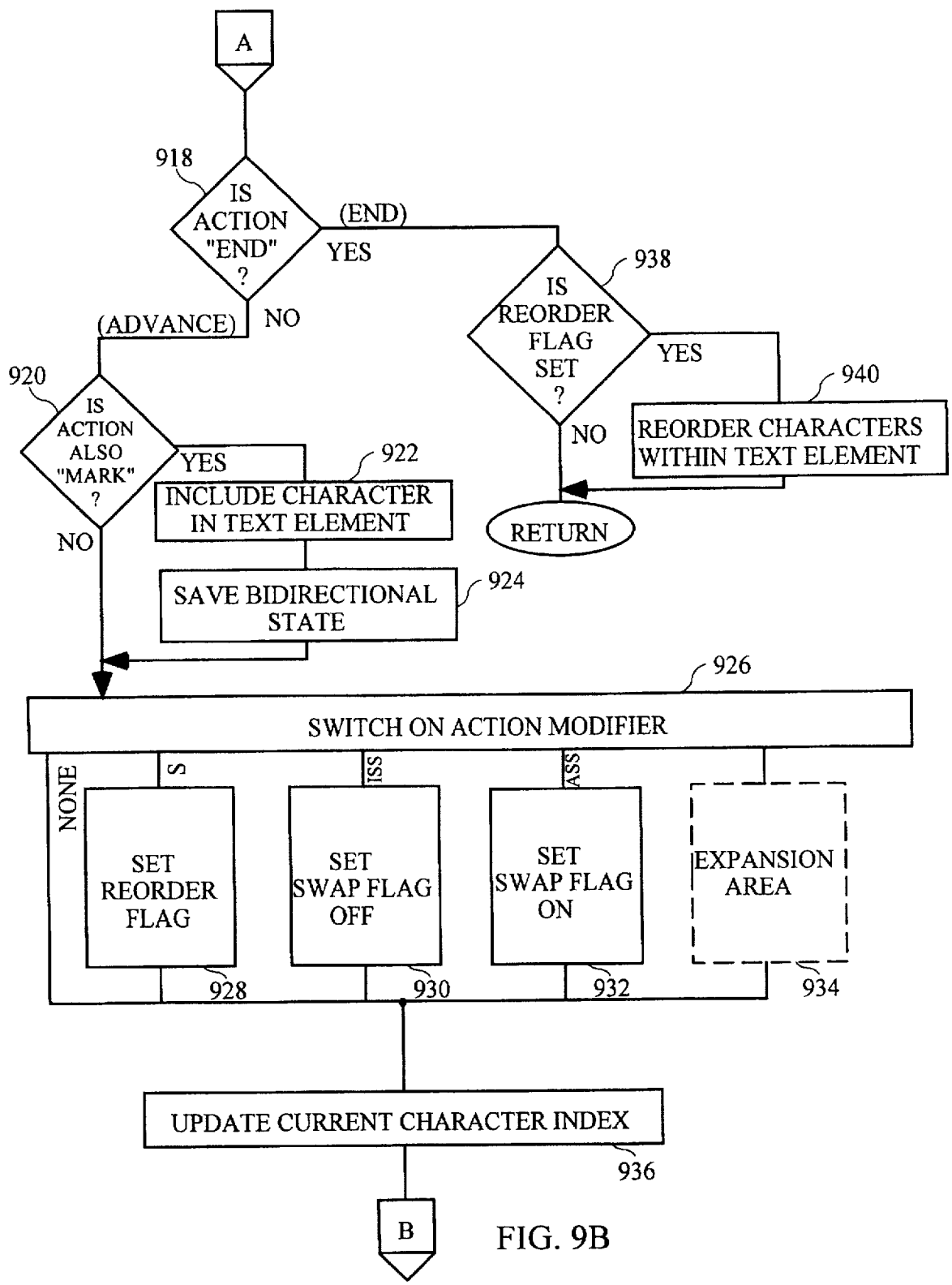

FIGS. 9A and 9B are flow charts of next text element processing 900. The next text element processing 900 details the operations performed by the block 706 in FIG. 7 in obtaining the next text element. Preferably, the next text element processing 900 is performed by the scanner 408 in conjunction with the scanner table 410.

The next text element processing 900 begins by initializing 902 state and reorder flags. Next, a decision 904 is made based on whether the mapping table 414 needs direction information. If the mapping table 414 requires direction information, then the direction of the Unicode string 404 is resolved 906. The processing associated with resolving 906 the direction is discussed in detail in commonly-assigned U.S. patent application Ser. No. 08/527,827, entitled "BIDIRECTIONAL CODE CONVERTER", which is hereby incorporated by reference. After the direction is resolved 906 or after the decision 904 in the case where direction is not required, a decision 908 is made based on the context of the character. If the context of the characters within the Unicode string 404 can effect the code conversion (mapping), the context is resolved 910. The processing associated with resolving or determining 910 the context is discussed in detail in commonly-assigned U.S. application Ser. No. 08/527/837, entitled "CONTEXT-BASED CODE CONVERTER", which is hereby incorporated by reference. Following block 910 or following decision 908 when context is not important, the Unicode character is obtained 912 from the Unicode string 404. Here, the next character in the Unicode string 404 is obtained. Next, the attributes for the Unicode character obtained are looked-up 914. The attributes looked-up 914 are discussed in detail below with reference to FIGS. 10–12.

Then, the action for the next text element processing 900 is determined 916. The determination 916 of the action is explained in greater detail below with reference to FIGS. 13A, 13B and 14.

Next, a decision 918 is made based on whether the action is "END". If the action is not "END", then the action is at least an "ADVANCE". When the action is "ADVANCE", a decision 920 is then made based on whether the action is also "MARK". When the action is also "MARK", then the character is included 922 in the text element. Additionally, the bidirectional state is saved 924 when a "MARK" action is taken. The bidirectional state includes the directional embedding stack and the current state of the birdirectional state machine. Following block 924 or following decision block 920 when the action is not also "MARK", a switch operation 926 is performed based on an action modifier. The action modifier is a part of the action and includes modifiers such as "S", "ISS", "ASS". The action may also not have any action modifier. When the action modifier is "S", then a reorder flag is set 928. The reorder flag indicates (when set) that the characters within the text element may need to be reordered. When the action modifier is "ISS" (i.e., Inhibit Symmetric Swapping), then a swap flag is set off 930. When the action modifier is "ASS" (i.e., Activate Inhibit Swapping), the swap flag is set on 932. The swap flag indicates whether or not symmetric swapping is needed. The switch 926 can easily be adapted to include additional action modifiers using an expansion area 934. The expansion area 934 enables users to modify the behavior of the scanner 408. Also, if there is no action modifier, then the next text element processing 900 does not perform any operation associated with action modifiers. Following the action modifier operations, a current character index is updated 936. The current character index is a pointer into the source string used to scan through the source string when performing the next text element processing 900. The next text element processing 900 then repeats operations beginning at block 904. The processing loops through blocks 904–936 until the decision 918 determines that the action is "END". When the action is "END", decision 918 causes a decision block 938 to be performed. The decision block 938 determines whether the reorder flag is set. If the reorder flag is set (block 928), then characters within the text element are reordered 940. The reordering is preferably performed using the priority attribute which provides weighting values for different character classes. Following block 938 in the case where the reorder flag is not set or following block 940 in the case when the reorder flag is set, the next text element processing 900 is complete and returns to the Unicode converter processing 700.

Figure 10:
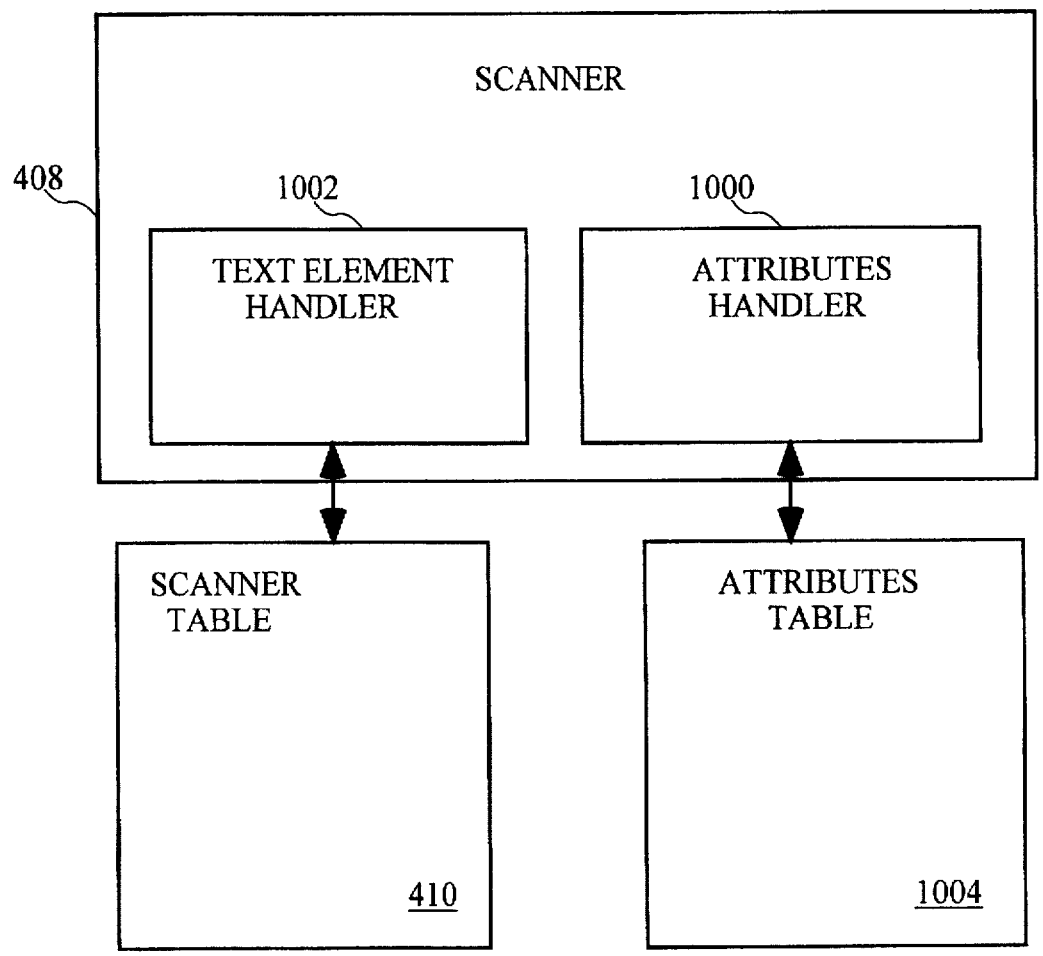
FIG. 10 is a block diagram of a scanner according to an embodiment of the invention.
Figure 15:
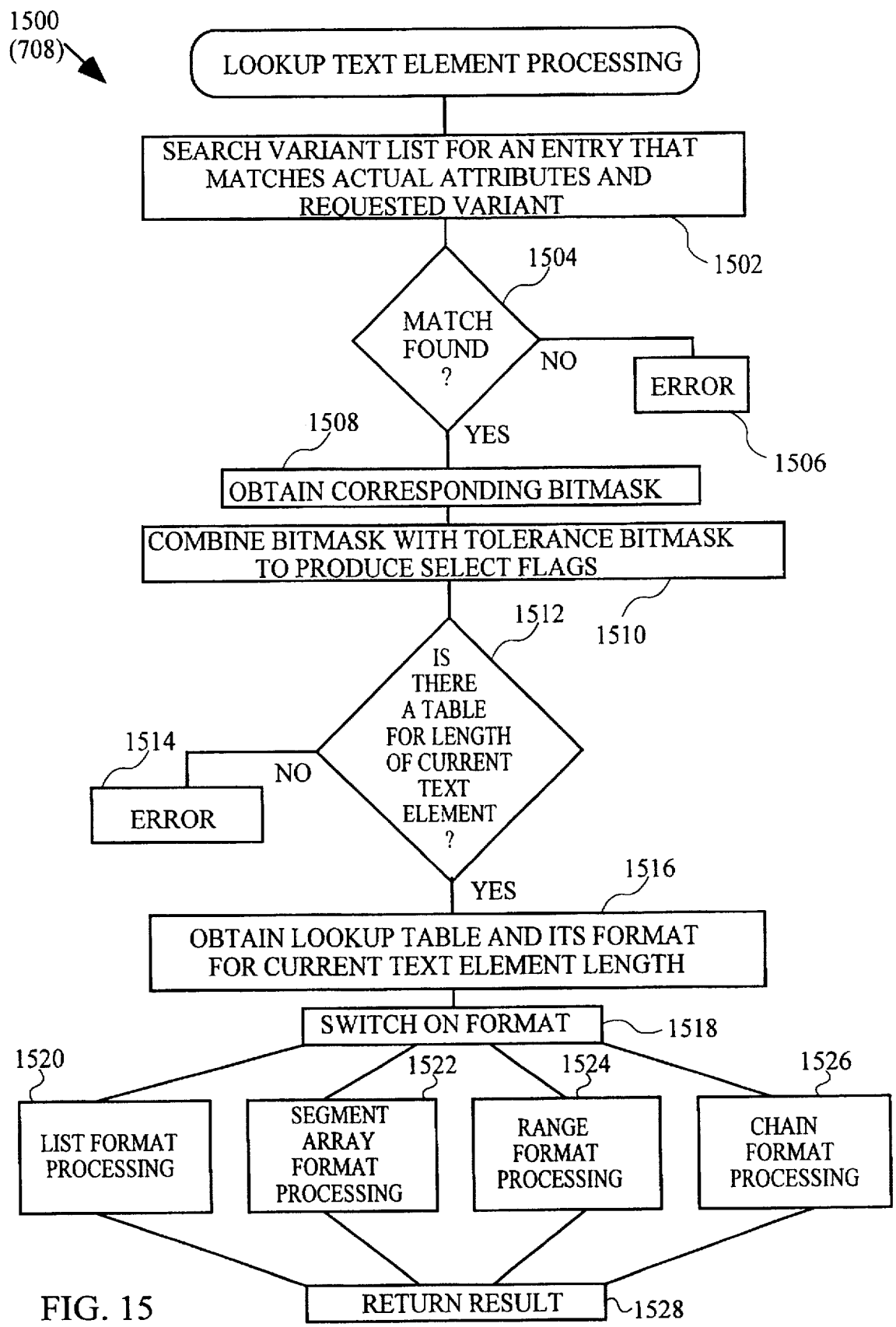
FIG. 15 is a flow chart of lookup text element processing according to an embodiment of the invention.

FIG. 10 is a block diagram of the scanner 408. The scanner 408 among other things, includes an attributes handler 1000 and a text element handler 1002. The text element handler 1002 performs the next text element processing 900 described above with reference to FIGS. 9A and 9B. The attributes handler 1000 interacts with an attributes table 1004 to obtain the attributes for a Unicode character, as needed by the next text element processing 900 (see block 914 of FIG. 9A). The attributes include the following: direction, class, priority, symmetric swapping, subset and context. The direction attribute is used in resolving direction (FIG. 15). The class attribute is used by the scanner 408 to determine actions (e.g., ADVANCE, END). The priority attribute is used for recording the characters within a text element (see block 940, FIG. 9B). The symmetric swapping attribute is used to whether or not symmetric swapping is needed. The context attribute is used in resolving context (FIG. ?).

Figure 11:
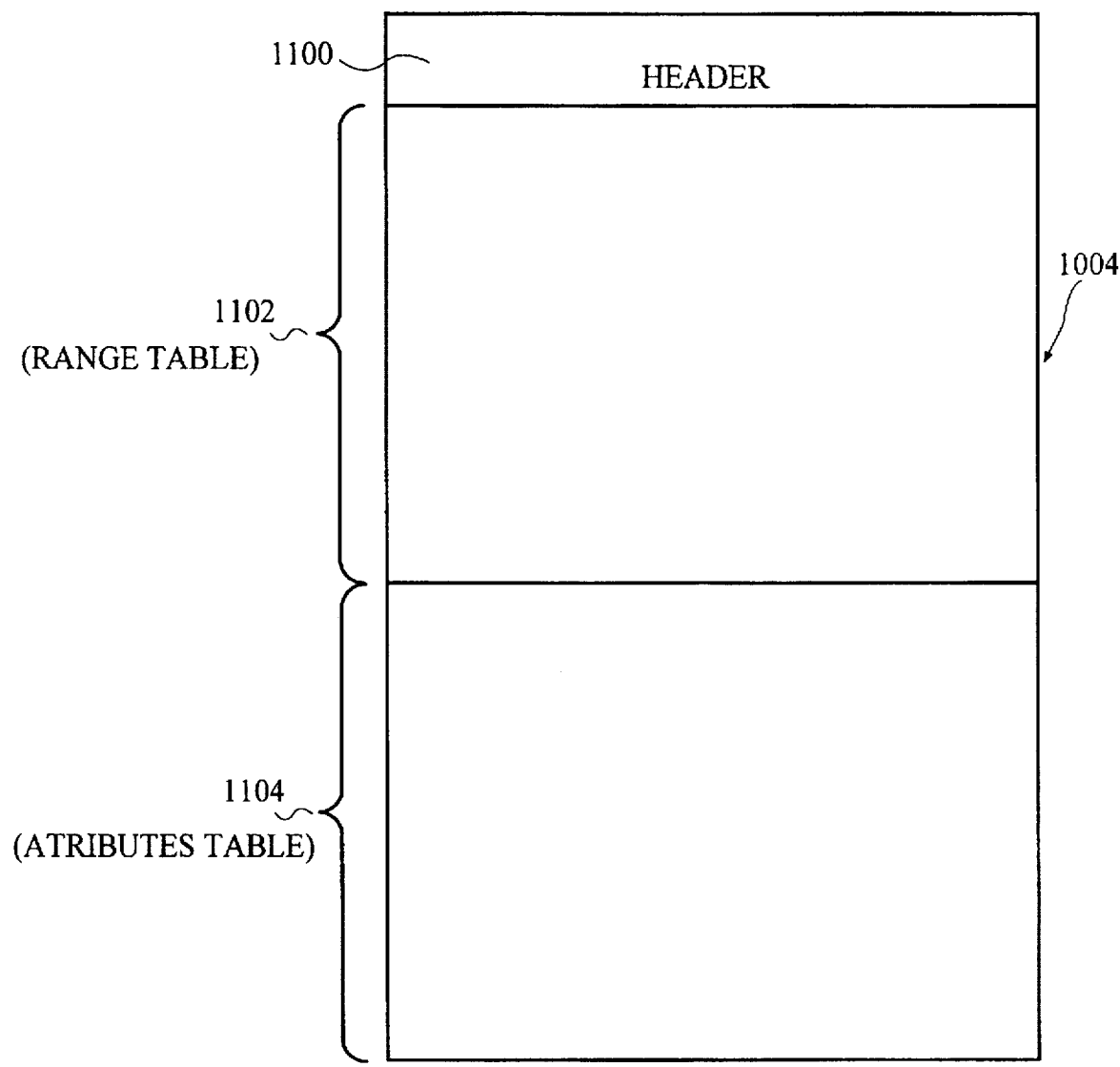
FIG. 11 is a schematic diagram of a preferred format for the attributes table shown in FIG. 10.

FIG. 11 is a schematic diagram of a preferred format for the attributes table 1004 of FIG. 10. The attributes table 1004 includes a header portion 1100, a range table portion 1102, and an attributes table portion 1104. The header portion 1100 includes information concerning the following: total table size, checksum value, version, offset and number of elements for each table. The elements within the range table portion 1102 provide ranges in which the attributes are commonly grouped, and then for each such group provides a pointer to the appropriate portion of the attributes table portion 1104. The format of the range table portion 1102 of the attributes table 1004 includes, for each entry, a beginning of range value, an ending of range value, and a data word associated with the range. The arrangement of the attributes table 1004 facilitates compact storage of the attribute information. Alternative storage arrangements are possible but may be less efficient in terms of compactness of data storage.

Figure 12:
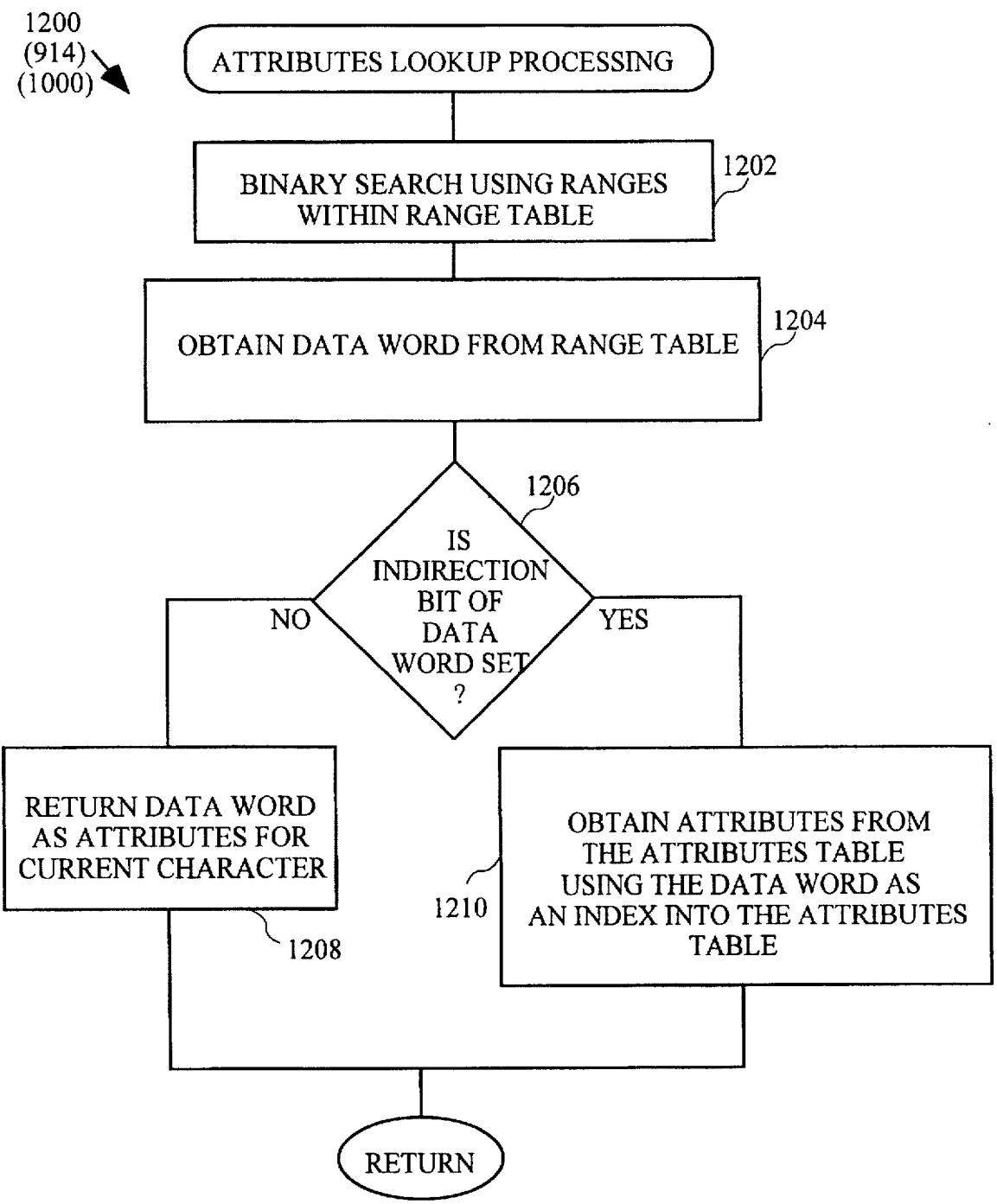
FIG. 12 is a flow chart of attributes lookup processing according to an embodiment of the invention.

FIG. 12 is a flow chart of attributes lookup processing 1200. The attributes look-up processing 1200 is performed by the attributes handler 1000, and initiated by the next text element processing 900 in block 914 of FIG. 9A.

The attributes lookup processing 1200 begins with a binary search using the ranges within the range table portion 1102 of the attributes table 1004. Once the appropriate range is identified by the binary search, the data word associated with that range is obtained 1204 from the range table portion 1102. Preferably, the first bit of the data word is an indirection bit. A decision 1206 is then made based on whether the indirection bit of the data word is set. In the case where the indirection bit of the data word is not set, the data word itself contains the attributes for the current character, therefore, the data word is returned 1208 as the attributes. On the other hand, when the indirection bit of the data word is set, then the attributes are obtained 1210 from the attributes table portion 1104 using the data word obtained from the range table portion 1102 as an index or offset into the attributes table portion 1104. Hence, the data word in this case is an index or offset to an array that contains the attributes for each character in the range. Following either blocks 1208 or 1210, the attribute lookup processing 1200 completes and returns.

Figure 13A:
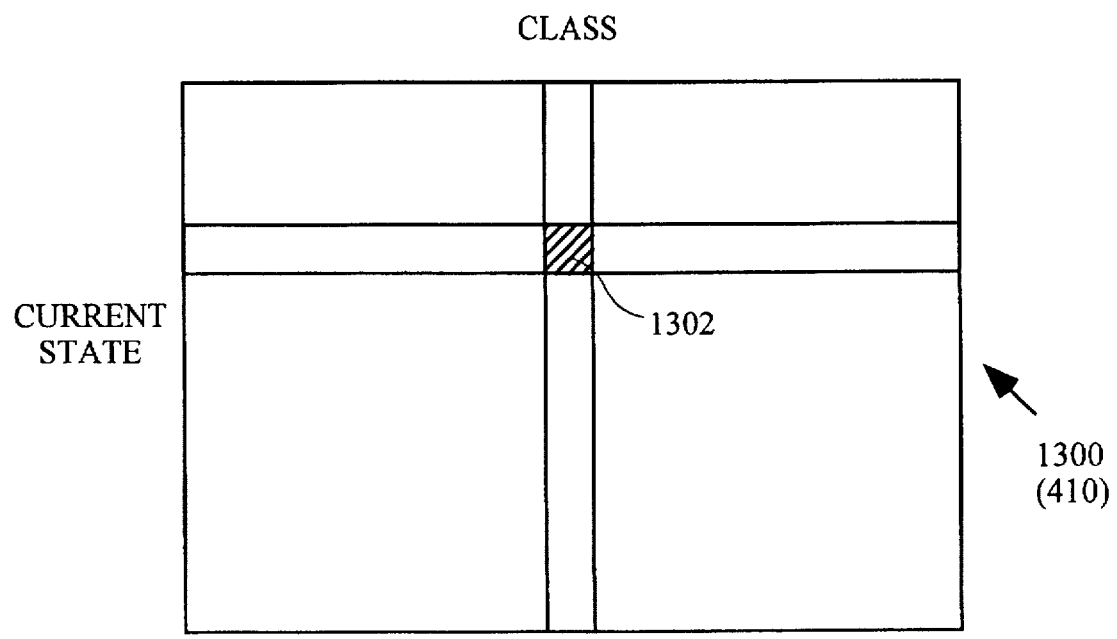
FIGS. 13A and 13B are schematic diagrams associated with a scanner table utilized by the scanner to determine the next action according to an embodiment of the invention.
Figure 13B:
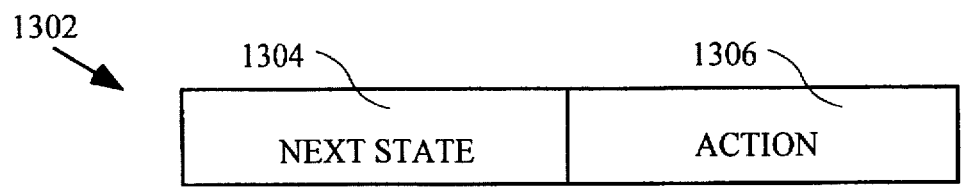

FIGS. 13A and 13B are schematic diagrams associated with a scanner table 1300 (410) utilized by the scanner 408 to determine the next action. The next action determination is invoked by block 916 of the next text element processing 900 (FIG. 9A). Recall, that the next action is used in determining the next text element. FIG. 13A illustrates a preferred format for the scanner table 1300 for use with the invention. The scanner table 1300 is a two-dimensional array having "current state" as one index and "class" as another index. The "class" refers to the class attribute. These indexes select a representative element 1302 within the scanner table 1300. FIG. 13B illustrates the representative element 1302 of the scanner table 1300. The representative element 1302 includes a next state portion 1304 containing a next state for the scanner 408, and the action portion 1306 indicates the action for the scanner 408. In effect, the scanner 408 together with the scanner table 1300 implement a state machine to determine how the scanner should operate.

The scanner table 1300 provides different next states and actions for different character encodings. FIG. 14 is a table 1400 which represents both a preferred layout and the information which would be stored in the scanner table 1300. The notations associated with the table are as follows:

Character Classes:
CC—Control character
OS—Other spacing
NS—Non-spacing
LD—Latin digit
FS—Fraction slash
JL (f)—Jamos leading consonant (filler)
JV (f)—Jamos vowel (filler)
JT—Jamos consonant trailer
NU—Not a valid Unicode character
ISS—Inhibit symmetric swapping
ASS—Activate symmetric swapping Next States:
State 0—End, determines if text element should be returned based on states of double and half diacritics
State 1—Start state
State 2—Add non-spacing (diacritics)
State 3—check for numeric fraction
State 7—Korean Jamos Actions:
Adv—[ADVANCE] advance to next character (the current may or may not be included in the current text element (TE)).
AdvMark—[ADVANCE+MARK] mark current character as last and advance to next character.
AdvMarkS—[ADVANCE+MARK+S] mark current character as last and advance to next character and set reorder flag.
AdvMarkASS—[ADVANCE+MARK+ASS] mark current character as last and advance to next character and activate symmetric swapping.
AdvMarkISS—[ADVANCE+MARK+ASS] mark current character as last and advance to next character and inhibit symmetric swapping.
End—End text element with last marked character.

NOTES

All functions check to see if reorder flag is set and reorder the non-spacing characters starting at start pointer. It is best to check the whole string because there may be more than one set of non-spacing marks which need to be reordered. Of course, after reordering the characters, the reorder flag is cleared.

Two examples of usage of the scanner table 1400 follow.

EXAMPLE 1

Input string "AAB"

The character class is OS for all three characters. The first character "A" is obtained. Beginning at the start state (state 1), the first action is AdvMark and the next state is state 2. This causes the first character "A" to be included within the current text element and causes the next character (second character "A") to be obtained. Then, at state 2, the action is End and the next state is state 0. Hence, the text element includes only the first text element. The same sequencing repeats for the second and third characters of this particular input string. Thus, each of the characters of the input string is assigned to a separate, but adjacent, text element.

EXAMPLE 2

Input string "AB"

The character class is OS for the first and last characters of the input string. The character class for the second character is NS because it is a combining mark. The first character "A" is obtained. Beginning at the start state (state 1), the first action is AdvMark and the next state is state 2. This causes the first character "A" to be included within the current text element and causes the next character (second character "'") to be obtained. Then, at state 2, the action is AdvMarkS and the next state is state 2. This causes the second character "'" to be included in the current text element. The third character is then obtained. The action at state 2 this time is End and the next state is state 0. Hence, the text element includes the first and second characters of the input string. The third character will be placed in its own text elements as was the case with Example 1.

FIG. 15 is a flow chart of lookup text element processing 1500. The lookup text element processing 1500 is performed by the lookup handler 412 and is invoked by the block 708 within the Unicode converter processing 700 (FIG. 7).

The lookup text element processing 1500 begins by searching 1502 a variant list for an entry that matches actual attributes and requested variant. The searching 1502 of the variant is described in detail below with reference to FIG. 20. Next, a decision 1504 is made based on whether a match was found. If no match was found, then an error results 1506. On the other hand, if a match is found, then the corresponding bit mask is obtained 1508 from the variant list. Preferably, the variant list contains three fields: a variant identifier, a set of attributes, and a bit mask. If the variant identifier and the set of attributes within the variant list match the actual attributes and the requested variant, then the corresponding bit mask is chosen from the variant list. Following block 1508, the bit mask is combined 1510 with a tolerance bit mask to produce select flags. The select flags form the selection mask used in selecting the subtables of the mapping table 414 as was discussed above. Preferably, the combining 1510 is a bitwise OR operation. Next, a decision 1512 is made based on whether there is a table within the mapping table 414 for the length of the current text element. If not, an error results 1514. On the other hand, if there is a table available for the length of the current text element, the lookup table and its format are obtained 1516 for the current text element length. Then, a switch operation 1518 is performed on the format. The formats available in this implementation are: list, segment array, range and chain. If the format is a list format, then list format processing 1520 is performed. If the format is segment array, then segment array format processing 1522 is performed. If the format is range, then range format processing is performed 1524. If the format is chain, then chain format processing 1526 is performed. Following blocks 1520-1526, the result is returned 1528, thereby completing the lookup text element processing 1500.

Figure 16:
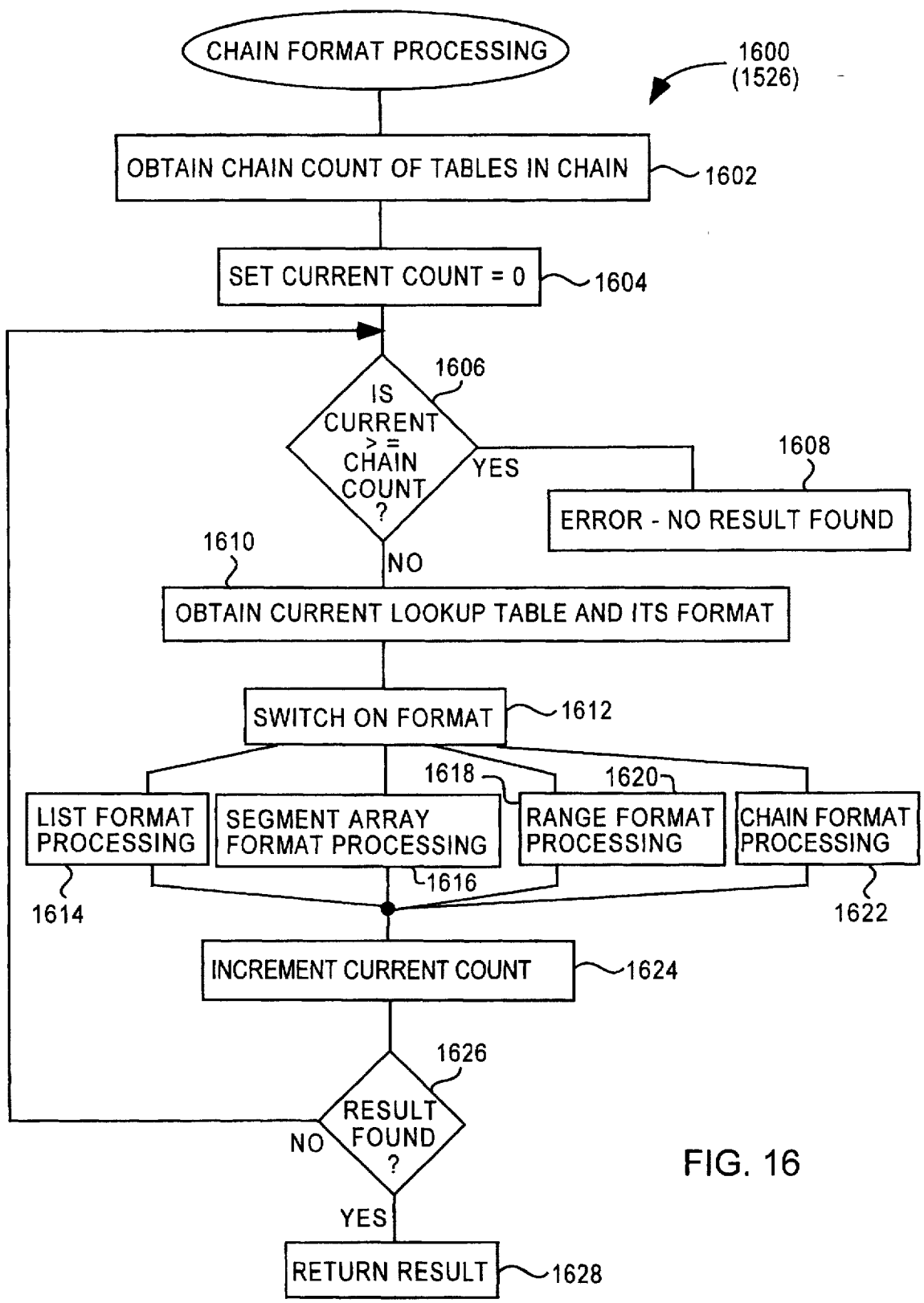
FIG. 16 is a flow chart of chain format processing according to an embodiment of the invention.

FIG. 16 is a flow chart of chain format processing 1600. The chain format processing 1600 is a processing performed by the chain format processing 1526 indicated in FIG. 15.

The chain format processing 1600 obtains 1602 a chain count of the numbers of tables in the chain. The current count is then set to zero 1604. Next, a decision 1606 is made based on whether the current count is greater than or equal to the chain count. If the current count is greater than or equal to the chain count, then the chain format processing 1600 returns 1608 indicating an error because no result was found. Otherwise, when the current count is not greater than or equal to the chain count, then the current lookup table and its format are obtained 1610. The formats used in this implementation are the same as used in FIG. 15. A switch operation 1612 is then performed based on the format. If the format is list, then list format processing 1614 is performed. If the format is segment array, then segment array format processing 1616 is performed. If the format is range, then range format processing 1620 is performed. If the format is chain, then chain format processing 1622 is performed. Following blocks 1614-1622, the current count is incremented 1624. Then, a decision 1626 is performed based on whether a result is found. If no result is found, then the chain format processing 1600 loops back to decision block 1606 to look through the next lookup table within the chain of tables. However, when the decision 1626 determines that the result is found, then the result is returned 1628, thereby completing the chain format processing 1600.

Figure 17:
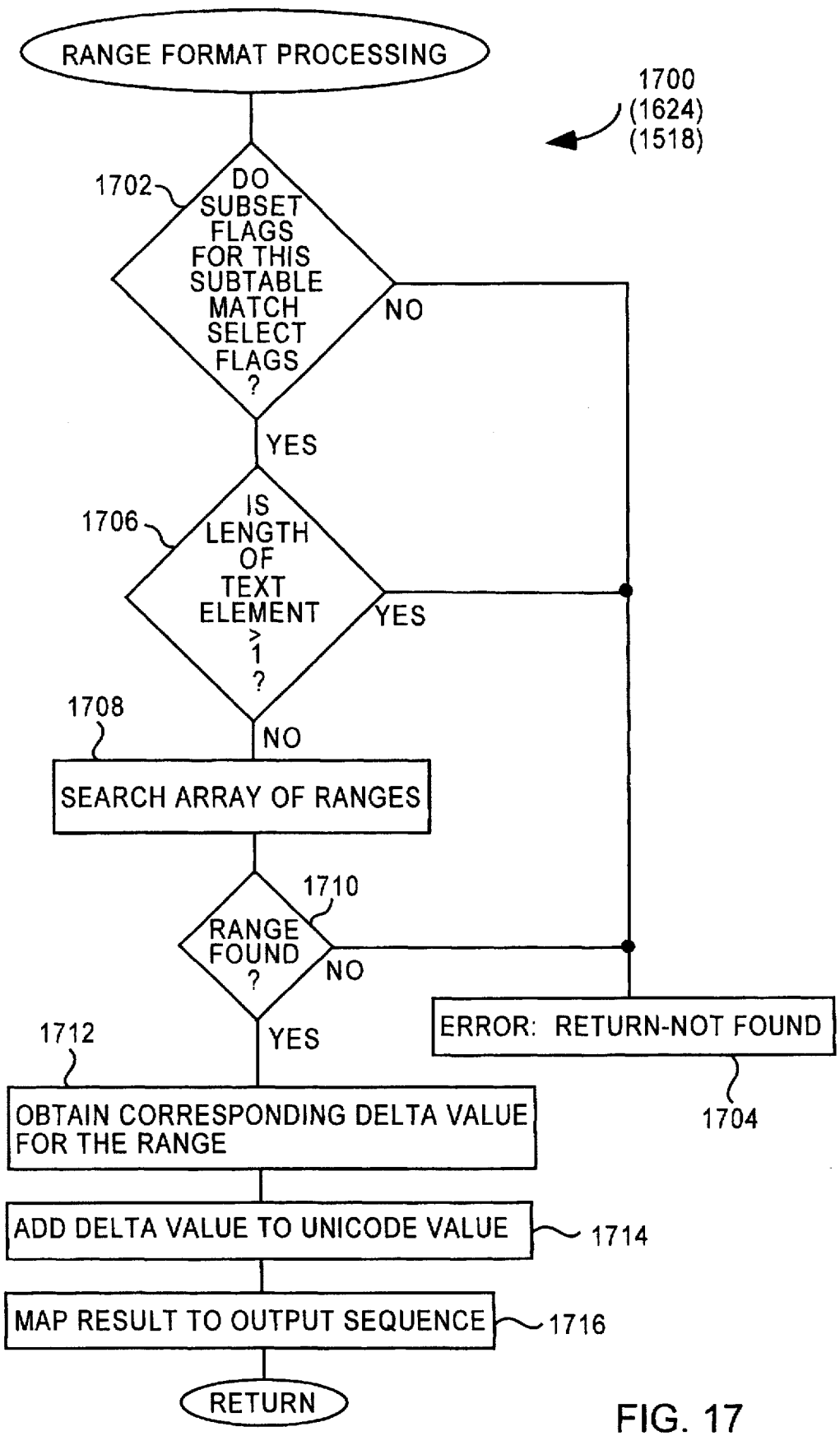
FIG. 17 is a flow chart of range format processing according to an embodiment of the invention.

FIG. 17 is a flow chart of range format processing 1700. The range format processing 1700 is the processing carried out by block 1524 in FIG. 15 and block 1618 in FIG. 16. The range format is a list of ranges of characters with a delta value associated with each field.

The range format processing 1700 begins with a decision 1702 based on whether the subset flags for this subtable match the select flags. The select flags for the selection mask, and the subset flags are for the subtable mask. If not, the range format processing returns 1704 indicating that no result was found using an error code. On the other hand, if the decision 1702 indicates that the subset flags for this subtable do match the select flags, then a decision 1706 is made based on whether the length of the text element is greater than one. If the length of the text element is greater than one, then this format is erroneously selected because the arrangement of the mapping tables for this particular implementation is such that the range format is only for a text element of length one. Hence, if the text element is greater than one, block 1704 is performed so as to return indicating no result was found. On the other hand, if the text element length is not greater than one, the range format processing 1700 continues. A subtable with the range format has an array of ranges, each range having a delta value associated therewith. The array of ranges is then searched 1708 to find the appropriate range for the Unicode character being converted. A decision 1710 is then made based on whether a range was found. If no range was found, then the range format processing 1700 returns 1704 indicating no result found using an error code. If, however, a range is found, then the corresponding delta value for the range is obtained 1712. The delta value is then added 1714 to the Unicode value. Thereafter, the result is mapped 1716 to an output sequence. The processing associated with the mapping 1716 of the result to the output sequence is explained in detail below with reference to FIGS. 22A-22C. Following block 1716, the range format processing 1700 is complete and returns.

Figure 18:
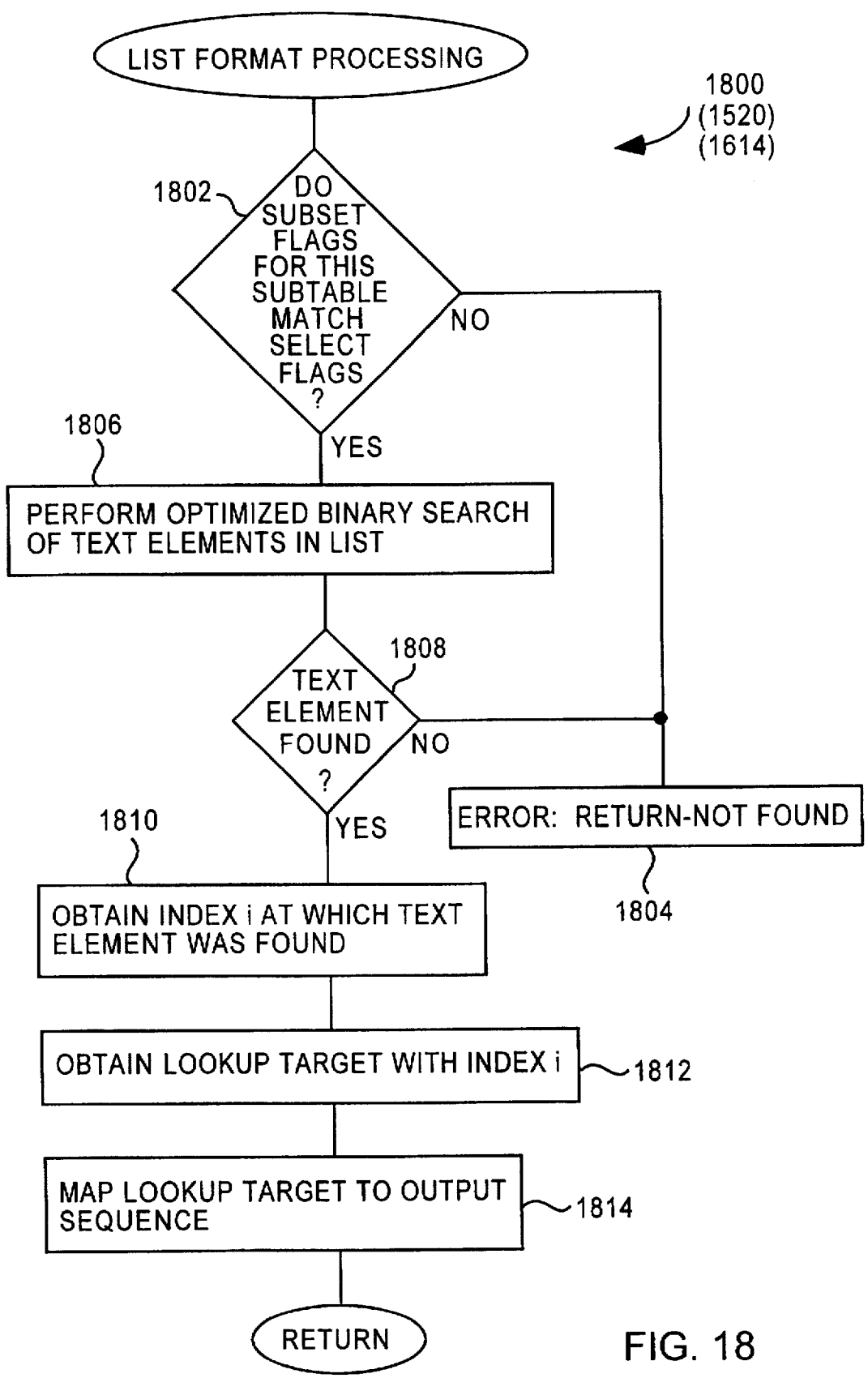
FIG. 18 is a flow chart of list format processing according to an embodiment of the invention.

FIG. 18 is a flow chart of list format processing 1800. The list format processing 1800 is the processing performed by block 1520 in FIG. 15 and block 1614 in FIG. 16. The list format is a ordered list of text elements, and the index i into the ordered list is an index into a corresponding list of lookup targets.

The list format processing 1800 begins with a decision 1802 based on whether the subset flags for this subtable match the select flags. If not, the list format processing 1800 returns 1804 indicating no mapping found using an error code. On the other hand, when the subset flags for this subtable do match the select flags, then an optimized binary search is performed 1806 on the text elements in the list. A decision 1808 is then made based on whether the search has found a text element in the list. If not, again the list processing returns 1804 indicating no mapping found. However, if the text element is found, then index i at which the text element was found is obtained 1810. The index i is then used to obtain 1812 a lookup target. The lookup target is then mapped 1814 to the output sequence. The list format processing 1800 is then complete and returns.

Figure 19A:
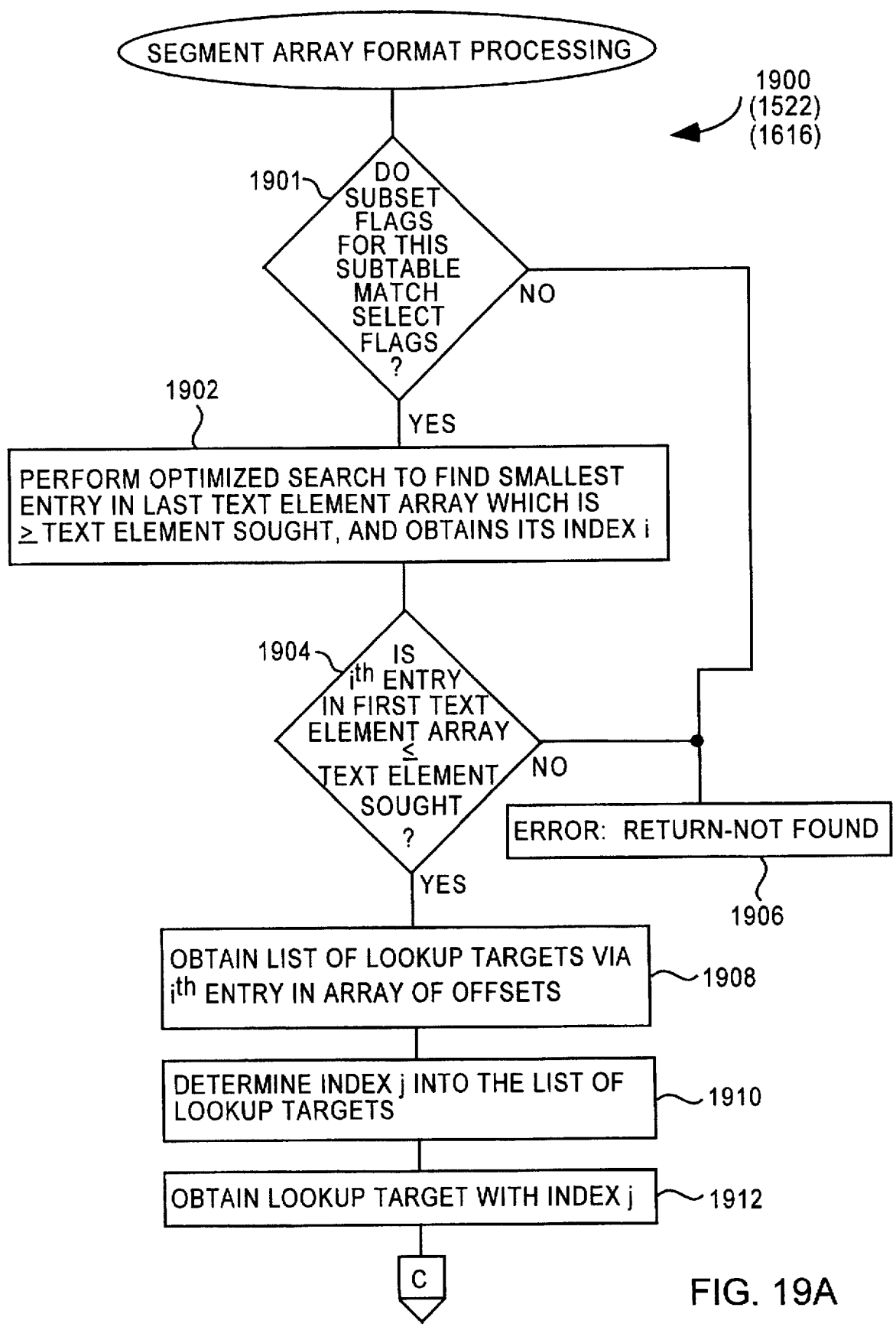
FIGS. 19A and 19B illustrate segment array format processing according to an embodiment of the invention.
Figure 19B:
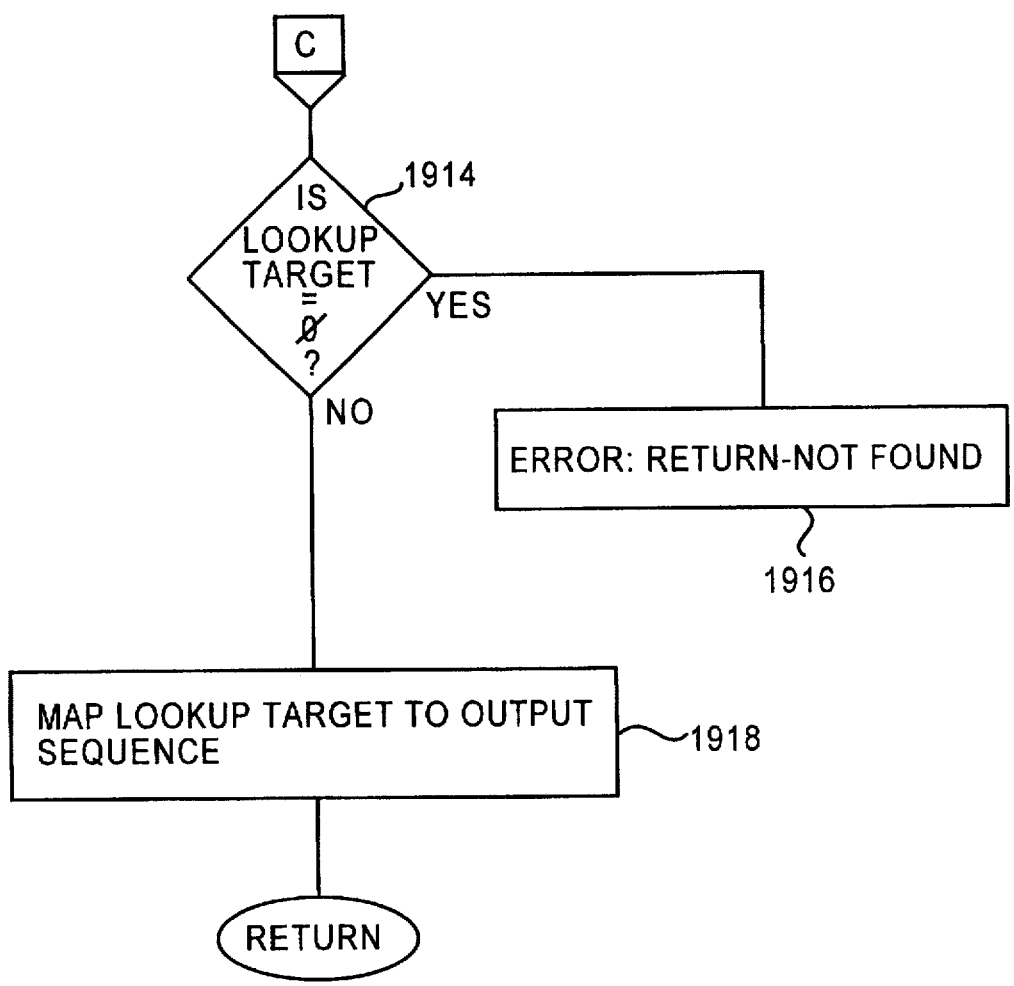

FIGS. 19A and 19B illustrate segment array format processing 1900. The segment array format processing 1900 is the processing performed by block 1522 in FIG. 15 and block 1616 in FIG. 16. The segment array format includes a first text element array, a last text element array, and a n array of offsets. The offsets in the array of offsets point to various lists of lookup targets.

The segment array format processing 1900 begins with a decision 1901 based on whether the subset flags for this subtable match the select flags. If the subset flags do match the select flags, then an optimized search is performed 1902. The optimized search finds the smallest entry in the last text element array which is greater than or equal to the text elements sought, and obtains the index i for this entry. Next, a decision 1904 is made based on whether the ith entry in the first text element array is less than or equal to the text element sought. If not, then the segment array format processing 1900 returns 1906 with an error code indicating no mapping found. Also, in the case in which decision 1901 fails, block 1906 is also performed. On the other hand, when the decision 1904 indicates that the ith entry in the first text element array is less than or equal to the text element sought, the ith entry is known to correspond to the text element sought. Then, a list of lookup targets is obtained 1908 via the ith entry in the array of offsets. That is, the offset provided by the ith entry in the array of offsets identifies the list of lookup targets. An index j into the list of lookup targets is then determined 1910. The index j is given the value of the text element sought less the first text element in the list (or range) of lookup targets obtained 1908. The lookup target with index j is then obtained 1912 from the list of lookup targets. Next, a decision 1914 is made based on whether the lookup target is equal to zero. If the lookup target is equal to zero, then the segment array format processing returns 1916 indicating no mapping found using an error code. On the other hand, if the lookup target is not equal to zero, then the lookup target is mapped 1918 to the output sequence. Following block 1918, the segment array format processing 1900 is complete and returns.

Figure 20:
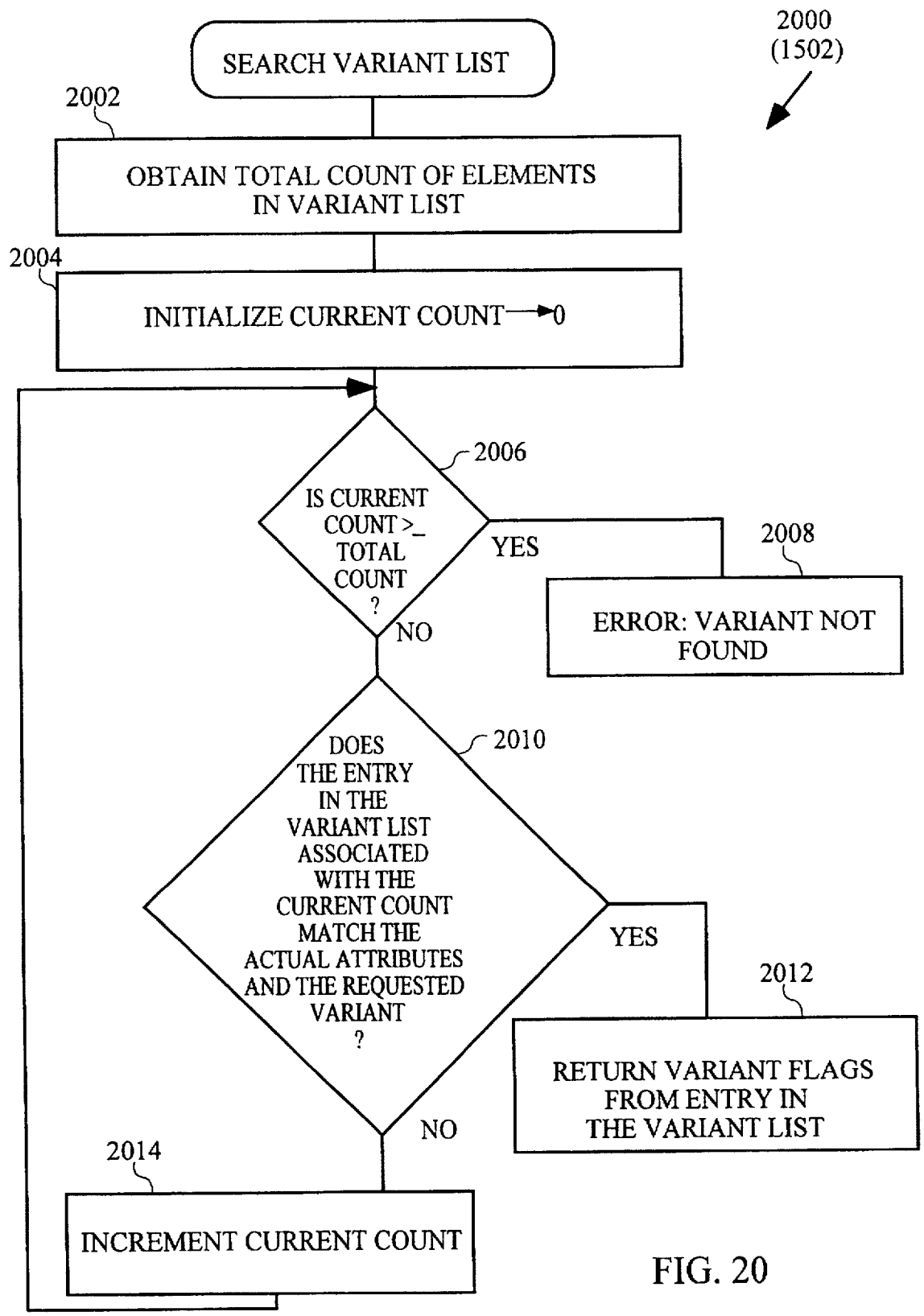
FIG. 20 is a flow chart illustrating search variant list processing according to an embodiment of the invention.

FIG. 20 is a flow chart illustrating search variant list processing 2000. The search variant list processing 2000 is processing performed by block 1502 in FIG. 15. In other words, the search variant list processing 2000 is part of the lookup text element processing 1500 performed by the lookup handler 412 in conjunction with the mapping table 414.

The search variant list processing 2000 obtains 2002 a total count of elements in the variant list. Then, the current count is initialized to zero 2004. A decision 2006 is then made based on whether the current count is greater than or equal to the total count. If the current count is greater than or equal to the total count, then the search variant list processing 2000 returns 2008 with an error code indicating the variant not found. On the other hand, if the current count is not greater than or equal to the total count, then a decision 2010 is performed based on whether the entry in the variant list associated with the current count matches the actual attributes and the requested variant. If they do match, then the variant flags from the entry in the variant list are returned 2012. Otherwise, the current count is incremented 2014 and then the processing returns to block 2006 to continue to loop through the available variants in the variant list until either one matches or all of the variants have been considered.

Figure 21A:
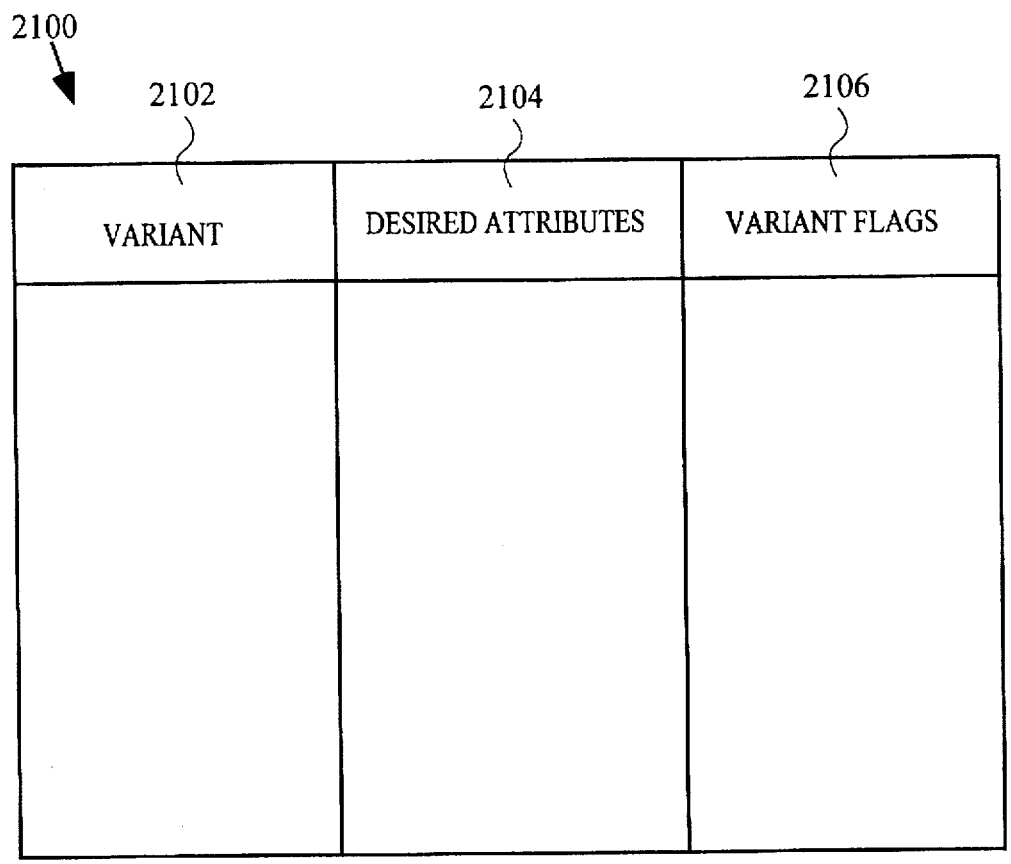
FIGS. 21A and 21B are schematic diagrams of tables and data formats associated with the variant list processing according to an embodiment of the invention.
Figure 21B:
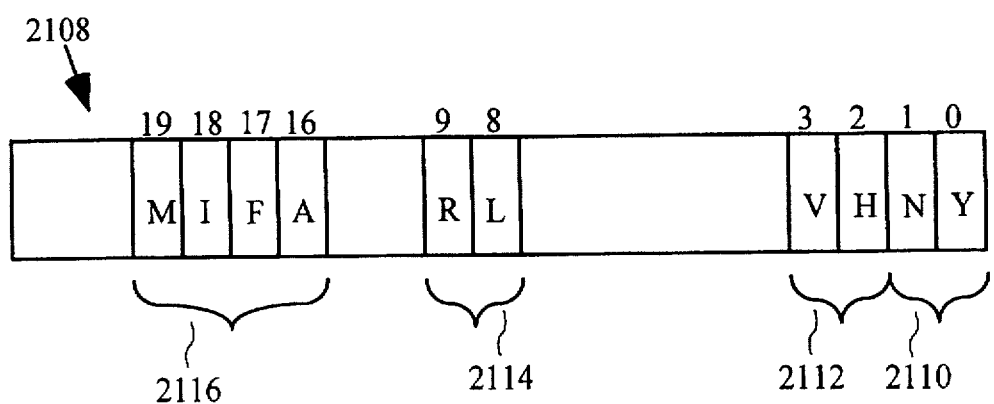

FIGS. 21A and 21B are schematic diagrams of the variant list 2100. As shown in FIG. 21A, the variant list 2100 includes a variant region 2102, a desired attributes region 2104, and variant flags region 2106. FIG. 21B illustrates an actual attributes bit mask in accordance with a preferred implementation. The actual attributes bit mask 2108 is a 32-bit variable having a first portion 2110 (bits 0 and 1) indicating the symmetric swapping state, a second portion 2112 (bits 2 and 3) indicating vertical or horizontal forms, a third portion 2114 (bits 8 and 9) indicating resolved direction, and a fourth portion 2116 (bits 16-19) indicating context. Each bit within a portion represents a flag. The bits contain the value "0" if the flag is unknown or not set and contains the value "1" when set. The caller sets the second portion 2110, and the scanner 408 sets the first, third and fourth portions 2110, 2114 and 2116.

A desired attributes bit mask is formatted like the actual attributes bit mask, but sets the bits depending on which of the attributes is important to obtain the correct mapping for the particular table and variant (as determined by the design of the mapping table 414). The bits in the desired attributes bit mask are set to "1" for each attribute to be considered in making the mapping determination, but if all bits of a portion are set to "1", the attribute is ignored during mapping. For example, if bit 0 is "1" and bit 1 is "0", then symmetric swapping is on and will be considered when mapping is performed. On the other hand, if both bits 0 and 1 are "1", symmetric swapping is completely ignored. The remaining unused bits of the desired attributes bit mask are set to "1" and can be later assigned values if needed. A few examples of the desired attributes bit mask follow.

Suppose the direction is to be left-to-right and none of the other attributes matter. Then the desired attribute bit mask would be: xFFFFFDFF. Whereas, if the direction is to be right-to-left, with symmetric swapping on, the desired attribute bit mask would be: xFFFFFEFD. If the direction is to be right-to-left, with symmetric swapping off, the desired attribute bit mask would be: xFFFFFEFE. With each of the above different desired attribute bit mask, a different conversion code could be selected. For example, in mapping the Unicode character u0028 to MacArabic, yields x28 for the desired attribute bit mask xFFFFFDFF, xA8 for the desired attribute bit mask xFFFFFEFD, and xA9 for the desired attribute bit mask xFFFFFEFE.

Figure 22A:
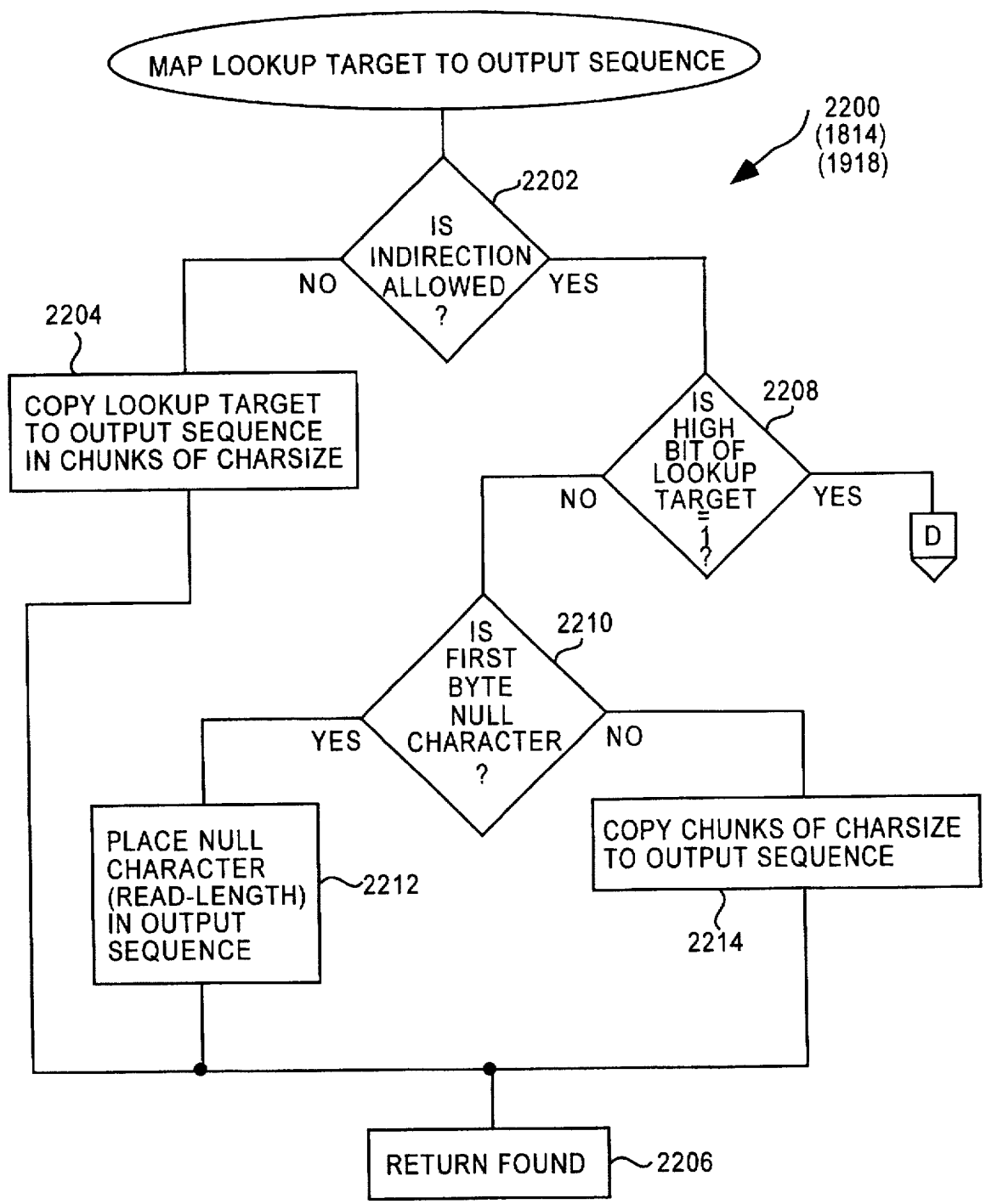
FIGS. 22A, 22B and 22C are flow charts illustrating map lookup target to output sequence processing according to an embodiment of the invention.
Figure 22B:
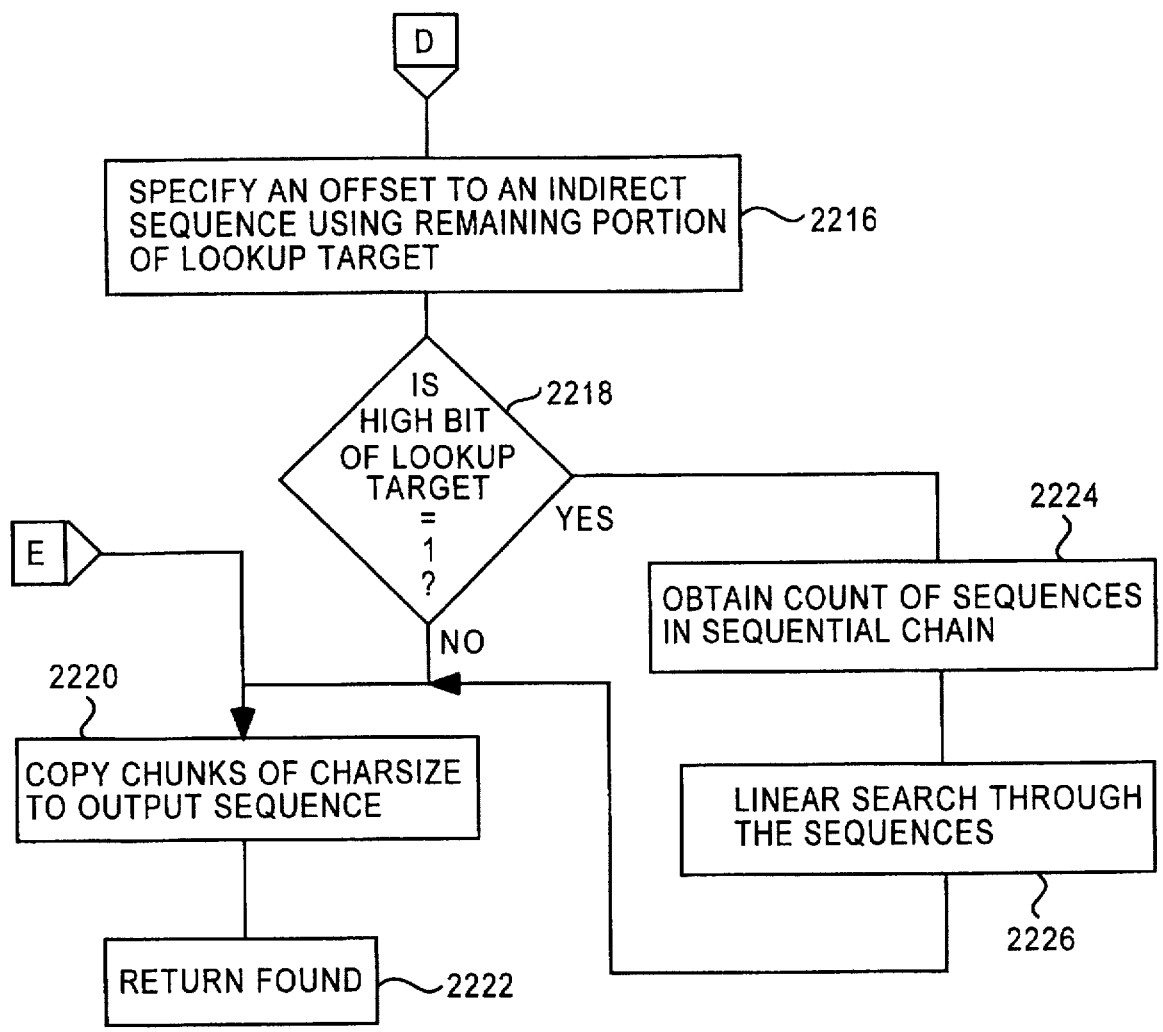
Figure 22C:
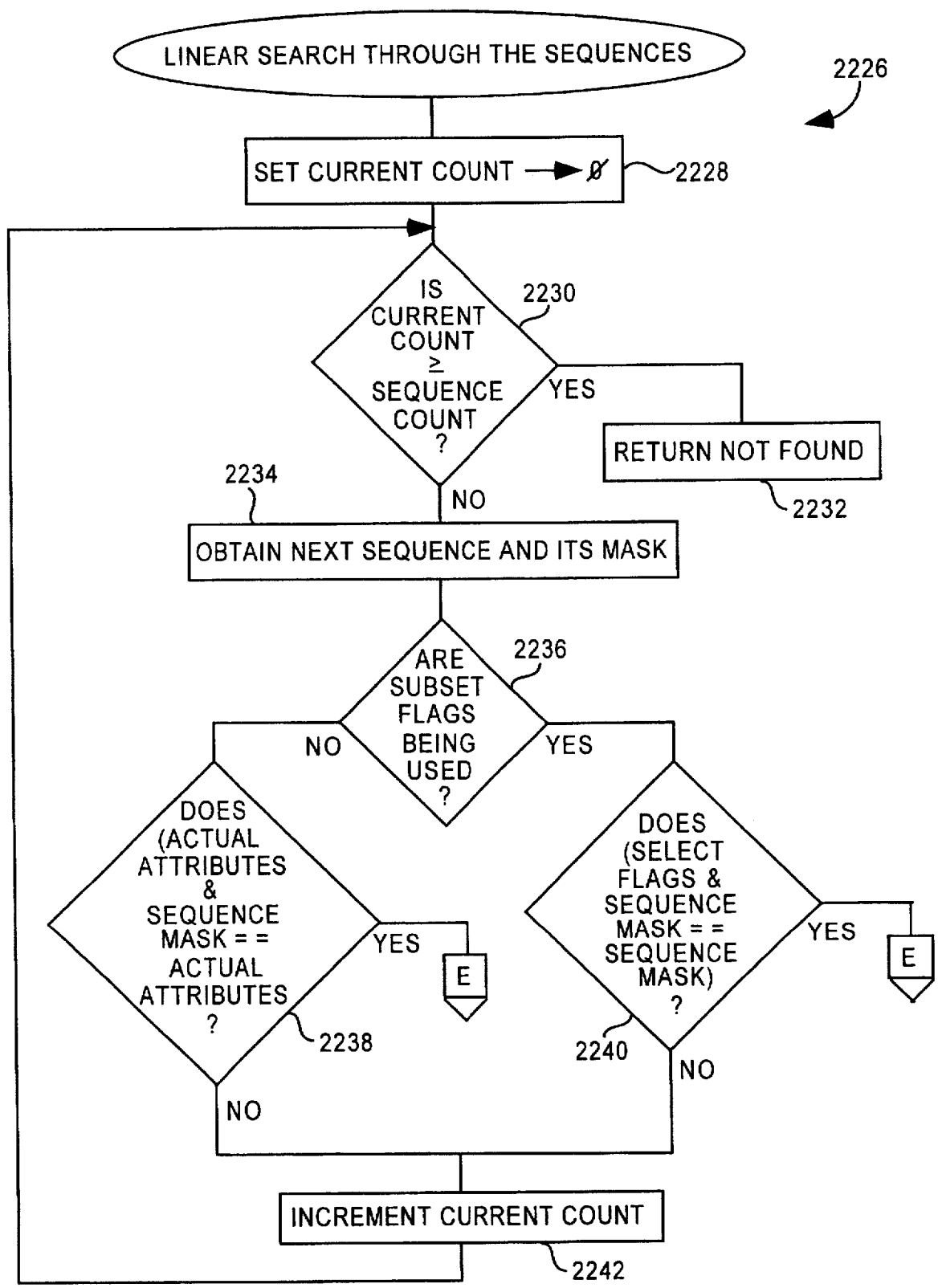

FIGS. 22A, 22B and 22C are flow charts illustrating map lookup target to output sequence processing 2200. The map lookup target to output sequence processing 2200 is associated with block 1814 in FIG. 18 and block 1918 in FIG. 19A.

The map lookup target to output sequence processing 2200 begins with a decision 2202 based on whether indirection is allowed. If indirection is not allowed, then the lookup target is copied 2204 to the output sequence in chunks of charsize. Charsize refers to the minimum size of a character in the target encoding and is specified in the header 500 of the mapping table 414. Following block 2204, the processing 2200 is complete and returns 2206 indicating a result found. On the other hand, if decision 2202 determines that indirection is allowed, then a decision 2208 is made based on whether the high bit of the lookup target is equal to one. If the high bit is not equal to one, then a decision 2210 is made based on whether the first byte indicates a null output sequence (i.e., an output sequence of length 0). If the first byte indicates x7F, then a null output sequence is indicated 2212 (a match found, but no characters added to the output sequence). Otherwise, when the first byte does not indicate a null output sequence, chunks of charsize are copied 2214 to the output sequence. In this case, the first byte preferably indicates length of the output sequence. Following blocks 2212 and 2214, block 2206 is performed to thereby complete the processing 2200 and return indicating a result found.

However, in the case where the decision 2208 determines that the high bit of the lookup target is equal to one, then additional processing is required because the lookup target provides an indirect reference to the output sequence desired. In particular, an offset to an indirect sequence is specified 2216 using the remaining portion of the lookup target. A decision 2218 is then made based on whether the high bit of the remaining portion of the lookup target is equal to one. If it is not, then chunks of charsize are copied 2220 to the output sequence, and then the processing 2200 completes by returning 2222 an indication that the mapping was found. On the other hand, when the high bit of the remaining portion of the lookup target is determined 2218 to be equal to one, then a count of sequences in the sequential chain is obtained 2224, and a linear search 2226 is carried out through the sequences to identify a mapping. Following block 2226, previously described blocks 2220 and 2222 are performed.

FIG. 22C details the operations performed by block 2226 in FIG. 22B. Recall, block 2226 in FIG. 22C performs a linear search through the sequences. Initially, the current count is set 2228 to zero. A decision 2230 is then made based on whether the current count is greater than or equal to the sequence count. If the current count is greater than or equal to the sequence count, then the map lookup target to output sequence 2200 returns 2232 with an indication that the mapping was not found. On the other hand, when the current count is not greater than or equal to the sequence count, then a next output sequence and its sequence mask are obtained 2234. The sequence mask is a mask used to choose one of several output sequences. A decision 2236 is then made based on whether the subset flags are being used. If the subset flags are not being used, then a decision 2238 determines whether the actual attributes logically ANDed with the sequence mask is bit-wise equal to the actual attributes. If so, the processing performs blocks 2220 and 2222 previously described because the mapping has been found. If, however, decision 2236 determines that the subset flags are being used, then a decision 2240 is made based on whether select flags logically ANDed with the sequence mask is bit-wise equal to the sequence mask. If so, blocks 2220 and 2222 previously described are performed because the mapping has been found. Hence, blocks 2238 and 2240 are two different ways to obtain the correct output sequence. On the other hand, when either decision blocks 2238 or 2240 indicate that the current sequence is not the correct mapping, then the current count is incremented 2242 and the processing returns to block 2230 to repeat the operations for the next sequence in the chain.

Figure 23:
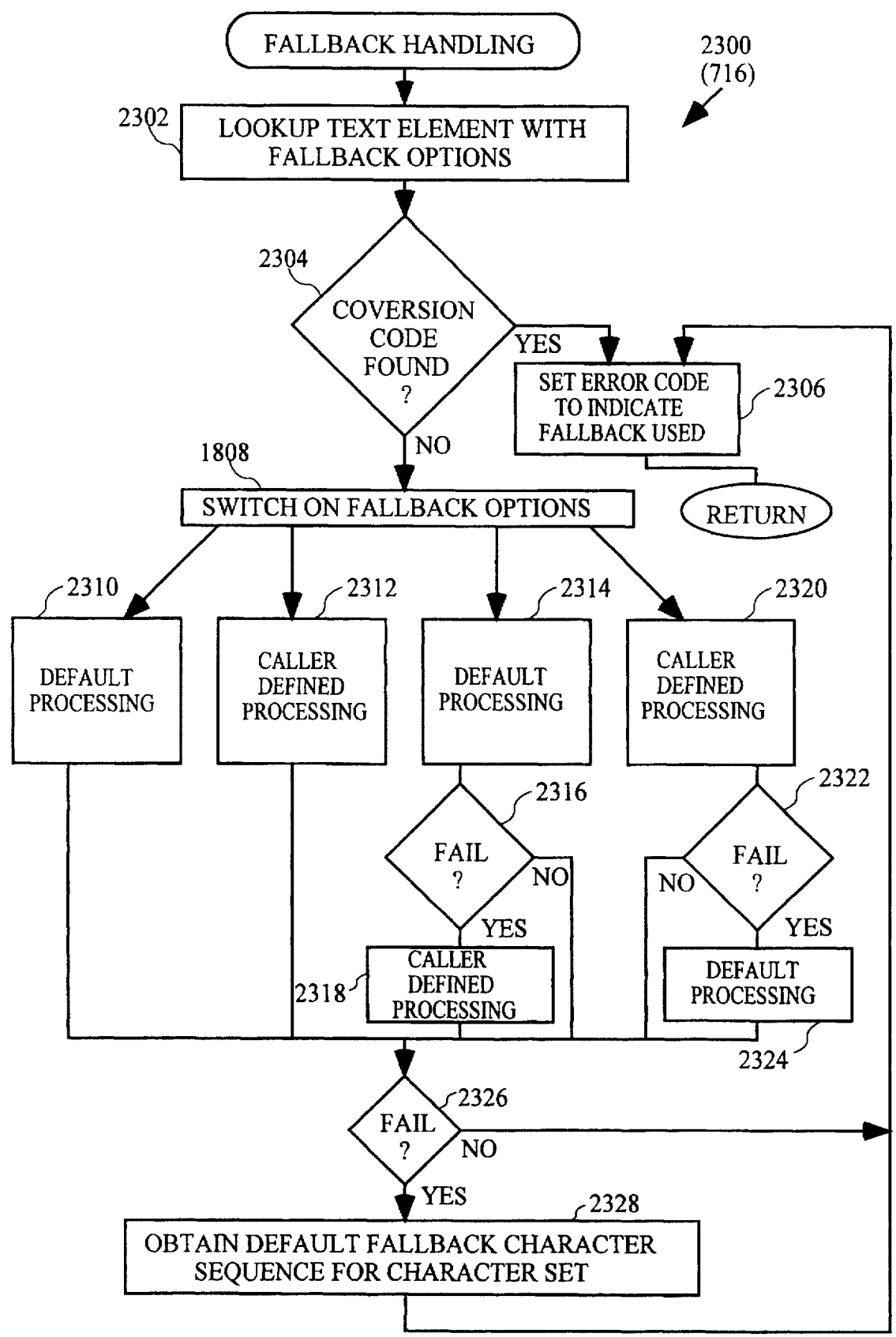
FIG. 23 is a flow chart illustrating fallback handling processing in accordance with the invention processing according to an embodiment of the invention.

FIG. 23 is a flow chart illustrating fallback handling processing 2300 in accordance with the invention. The fallback handling processing 2300 is the processing performed by the fallback handler 416 and invoked by block 716 of the Unicode converter processing 700 shown in FIG. 7.

The fallback handling processing 2300 looks-up 2302 the text element with fallback options. The lookup 2302 is similar to the lookup text element processing 1500 described above with respect to FIG. 15. The only significant difference is that now the fallback options are set so that additional subtables are considered via the select flags which have changed. Next, a decision 2304 is made based on whether conversion code for the text element was found. If conversion code was found, then an error code is set 2306 to indicate what fallback was used in obtaining the conversion or mapping. Following block 2306, the fallback handling processing 2300 is complete and returns.

On the other hand, when the decision 2304 indicates that the conversion code is not found, then a switch operation 2308 is performed based on the fallback options. The fallback options are: default, caller defined, default followed by caller defined, or caller defined followed by default. If the fallback option is default, then the switch operation 2308 causes default processing 2310 to be performed. If the fallback option is caller defined, then the switch operation 2308 causes caller defined processing 2312 to be performed. If the fallback option is default followed by caller defined, then the switch operation 2308 causes the default processing to be performed 2314, followed by a decision 2316 and caller defined processing 2318. The decision 2316 operates to bypass the caller defined processing 2318 when a default processing 2314 is successful. If the fallback option is caller defined followed by default processing, then the switch operation 2308 causes caller defined processing to be performed 2320, followed by a decision 2322 and default processing 2324. The decision 2322 operates to bypass the default processing 2324 when the caller defined processing 2320 is successful. Following the processing associated with the switch operation 2308, a decision 2326 is made based on whether the fallback processing 2300 has successfully identified a mapping or conversion code. If the fallback processing 2300 has been unsuccessful, then a default fallback character sequence for the character set is obtained 2328. The default fallback character sequence is the conversion code(s) used when fallback lookup 2302 fails to identify a conversion code. Preferably, the default fallback character sequence is contained within the header of the mapping tables 414. For example, for ASCII, the default fallback character is typically "?". Then, following block 2328 or following decision block 2326 in the case when the fallback processing was successful in obtaining a mapping or conversion code, an error code to indicate fallback options have been used is set 2306 and the fallback handling processing 2300 is complete and returns.

Figure 24:
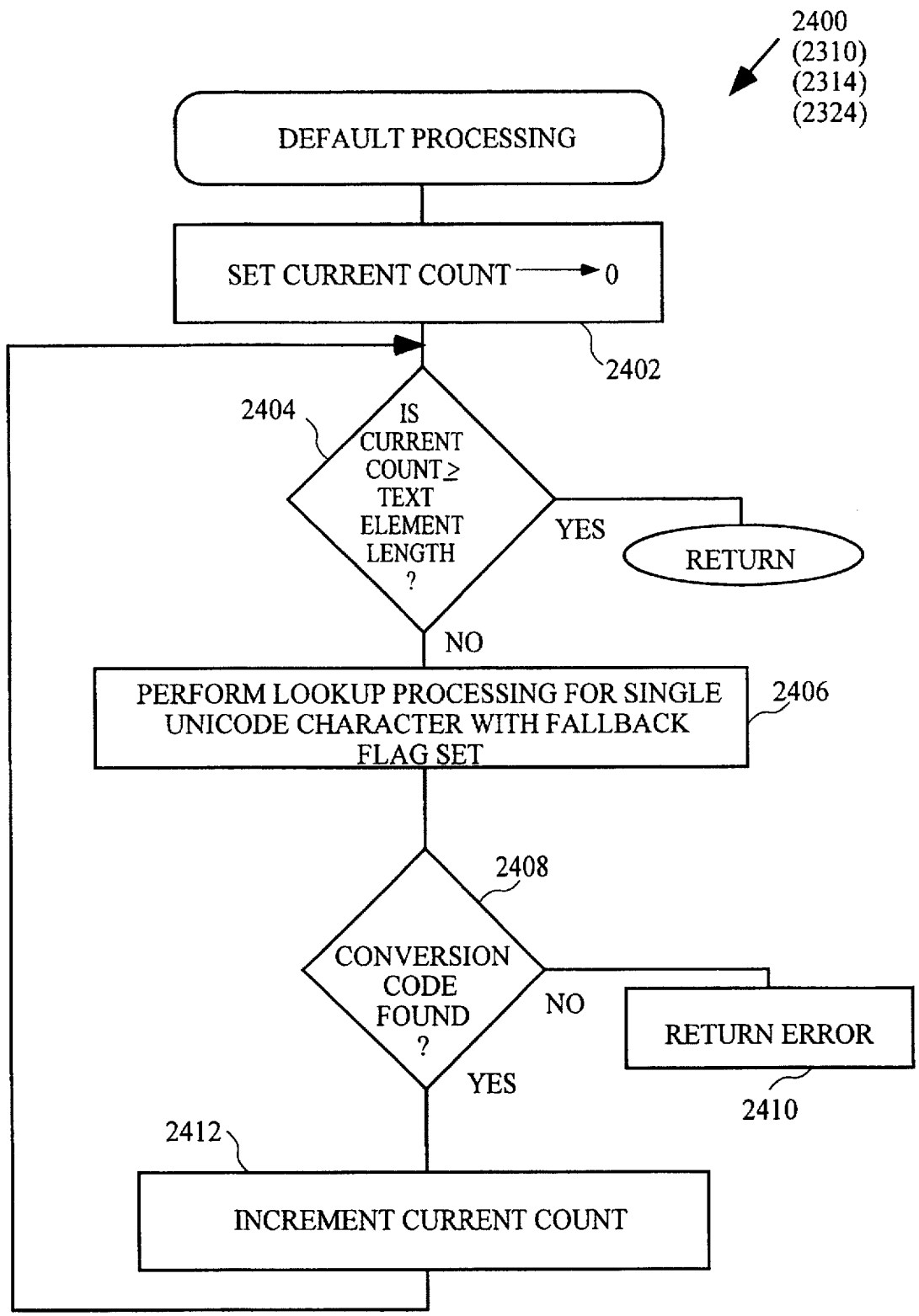
FIG. 24 is a flow chart illustrating default processing according to an embodiment of the invention.

FIG. 24 is a flow chart illustrating default processing 2400. The default processing 2400 is associated with the processing carried out by blocks 2310, 2314 and 2324 in FIG. 23.

A default processing 2400 initially sets 2402 a current count to zero. Next, a decision 2404 is made based on whether the current count is greater than or equal to the text element length. If it is, then the default processing 2400 is complete and returns. Otherwise, lookup processing is performed 2406 for a single Unicode character with fallback flags set. Here, the lookup is for individual characters of the text element, whereas before (block 2302) the lookup was for the entire text element. Then, a decision 2408 is made based on whether conversion code for the single Unicode character has been found. If not, then the default processing 2400 returns 2410 with an error code indicating that no individual mapping was available for the Unicode character. On the other hand, if a code conversion was found, then the current count is incremented 2412 and processing returns to block 2404 for processing of the next Unicode character within the text element.

Although FIGS. 4–24 discussed above pertain to converting from Unicode to a target encoding (From-Unicode), as mentioned above the Unicode code conversion system 300 is equally able to convert to Unicode from a different source encoding (To-Unicode). The To-Unicode is similar to the processing for From-Unicode but is substantially less complex. The To-Unicode processing usually does not need to scan for text elements or lookup multiple character sequences in determining the target encodings. Instead, the To-Unicode processing need only break the source string into individual characters and then find the corresponding code point in Unicode. However, in the rare case in which a mapping for a character can be influenced by the character that follows it (e.g., Indic scripts such as Devanagari, for example), scanning may be performed as discussed above.

Figure 25:
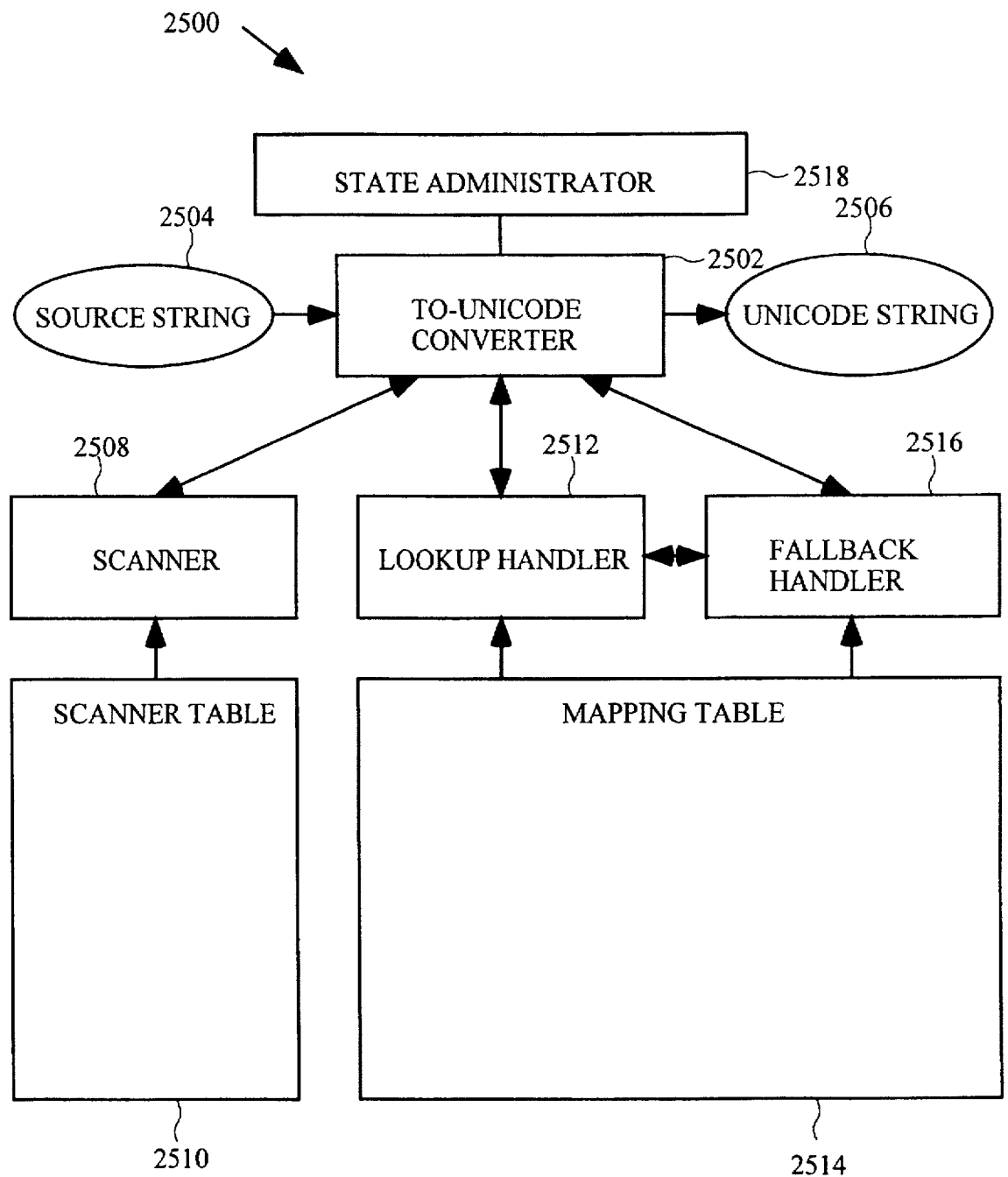
FIG. 25 illustrates a block diagram of an embodiment of a To-Unicode code conversion system according to an embodiment of the invention.

FIG. 25 illustrates a block diagram of an embodiment of a Unicode code conversion system 2500 according to the invention. The Unicode code conversion system 2500 converts to Unicode (i.e., To-Unicode processing). The Unicode code conversion system 2500 includes a To-Unicode converter 2502 which receives a source string 2504 and produces a Unicode string 2506. The To-Unicode converter 2502 performs the code conversion process via To-Unicode converter 2502 which interacts with a scanner 2508. The scanner 2508 in conjunction with the scanner table 2510 scans the source string 2504 to chunk the source string 2504 into characters. Here, unlike the From-Unicode situation, the source string is simply divided into individual characters. The To-Unicode converter 2502 then uses a lookup handler 2512 to look up the individual characters so as to obtain Unicode encodings therefor. The lookup handler 2512 uses the mapping table 2514 to obtain the character in Unicode. Additionally, the To-Unicode converter 2502 may also use a fallback handler 2516. The fallback handler 2516 operates together with the mapping table 2514 to identify one or more characters in the target encoding that are able to be used as a fallback mapping for the text element in cases where the lookup handler 2512 has been unable to identify a Unicode character.

The scanner 2508, the scanner table 2510, the lookup handler 2512, the mapping table 2514, the fallback handler 2516, the state administration 2518 are similar, but substantially less complex, than the corresponding devices in FIG. 4. Hence, these devices can be designed to implement both To-Unicode and From-Unicode processing. Further, when a given computer system or other electronic device is capable of performing both the To-Unicode and the From-Unicode processing, the computer system or other electronic device can operate as a hub. The hub could then operate to convert between various national character sets supported by Unicode. For example, a source national character set would first be converted to Unicode, and then converted to a target national character set.

The tables described above preferably use the formats discussed above to effectuate a compression of the data to be stored within the tables. The compression can be significant, for example, the attributes table is fifty times (50-to-1) smaller when compressed. However, those skilled in the art will recognize that the format of the tables may take many forms, some being easier to implement than others. The easiest implementation is typically a table without using any compression, however, this requires the most data storage. Further, although tables are used in the implementations discussed above, the behavior caused by these tables could instead be directly coded. However, direct coding would make changing the operating of the code conversion system difficult, whereas with tables typically only the tables would need to be changed to implement such changes.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A method for converting a source string into a target string, said method comprising:

(a) receiving a source string having a first character encoding;

(b) sequentially dividing the source string into text elements, each text element including one or more characters of the source string, and at least one of the text elements including a plurality of characters of the source string;

(c) obtaining attribute information for the text elements after or during said dividing (b);

(d) looking up in a mapping table a conversion code associated with a second character encoding for each of the text elements said looking up (c) in the mapping table of the conversion code for each of the text elements includes the operations of identifying a requested variant; selecting one of a plurality of mapping tables based on the attribute information, the requested variant, and a length of the text element; and looking up the conversion code from the selected one of the mapping tables; and (e) combining the conversion codes for the text elements so as to form a target string of the second character encoding.

2. A method as recited in claim 1, wherein the conversion code consists of one or more characters in the second character encoding, and wherein the attribute information obtained includes at least any two of direction, class, priority, subset, context, or symmetric swapping state.

3. A method as recited in claim 1, wherein the text elements are adjacent to one another, and wherein for each of the text elements including more than one character, the characters are adjacent in the source string.

4. A method as recited in claim 1, wherein the mapping table includes regular mappings and fallback mappings, and wherein said looking up (d) determines the conversion code for each of the text elements using the fallback mappings when the mapping table does not contain a conversion code for the text elements using the regular mappings.

5. A method as recited in claim 1, wherein each of the characters has a character class associated therewith, and wherein said dividing (b) is based at least in part on the character class of the characters within the source string.

27

6. A method as recited in claim 1, wherein said dividing (b) comprises:
(b1) obtaining a next source character from the source string;
(b2) determining whether the source character obtained should be included within a current text element or alternatively begin a new next text element;
(b3) placing the source character obtained in the current text element or the new next text element in accordance with said determining (b2); and
(b4) repeating (b1) through (b3) until the source string has been completely placed in text elements.

7. A method as recited in claim 6, wherein said determining (b2) comprises:
(i) looking up attributes associated with the source character, the attributes including at least a class indicator; and
(ii) determining whether the source character obtained should be included within the current text element or alternatively begin a new next text element based on the class indicator.

8. A method as recited in claim 6, wherein said determining (b2) comprises:
(i) looking up attributes associated with the source character, the attributes including at least a class indicator;
(ii) providing a state machine having a plurality of states, the state machine being used to determining whether the source character obtained should be included within the current text element or alternatively begin a new next text element based on the class indicator and a current state of the state machine; and
(iii) updating the current state of the state machine.

9. A method as recited in claim 1, wherein one of the first character encoding and the second character encoding conforms to The Unicode Standard.

10. A method as recited in claim 1, wherein said combining (e) comprises
(e1) determining a target character size for the second character encodings; and
(e2) forming the target string by copying the conversion codes for the text elements which have been looked up to the target string in units of the target character size.

11. A method as recited in claim 10, wherein the conversion code looked up (d) specifies an offset to an indirect encoding sequence.

12. A method as recited in claim 1, wherein said method further comprises:
(f) reordering, after said dividing (b) but prior to said look up (d), certain characters with each of the text elements if the certain characters are present in the text elements.

13. A method as recited in claim 12, wherein said reordering (f) is preferably performed using weighting values for different character classes.

14. A code conversion system for converting a source string to a target string, said system comprising:
a converter for controlling the conversion of the source string having a first character encoding into the target string having a second character encoding;
a scanner, operatively connected to said converter, for dividing the source string into text elements, each text element including one or more characters of the source string, and at least one of the text elements including a plurality of characters of the source string;
a mapping table for storing target encodings for text elements of the source encoding, said mapping table

28 includes a plurality of mapping portions, each of the mapping portions stores the target encodings for text elements of a different length, and an appropriate one of the mapping portions is utilized for each of the text elements defending on the lengths of the text elements; and
a lookup handler, operatively connected to said converter and said mapping table, for looking up in said mapping table a conversion code associated with a second character encoding for each of the text elements.

15. A code conversion system as recited in claim 14, wherein said system further comprises:
a fallback handler, operatively connected to said converter, for providing fallback conversion codes in certain cases, when said lookup handler is unable to provide a conversion code for one or more text elements, the fallback conversion codes contain one or more code points in the target encoding that are not exactly equivalent to the characters in the text element but have a graphical appearance that is similar.

16. A code conversion system as recited in claim 15, wherein said system further comprises:
scanner table means for assisting said scanner in determining whether individual characters in the input string should be included within a current text element or alternatively begin a new next text element.

17. A code conversion system as recited in claim 14, wherein said system further comprises:
a scanner table, operatively connected to said scanner, for assisting said scanner in determining whether individual characters in the input string should be included within a current text element or alternatively begin a new next text element.

18. A code conversion table as recited in claim 17, wherein the characters of the source string have a character class associated therewith, and
wherein said scanner table comprises an array of elements, said array being indexed by character class.

19. A code conversion system as recited in claim 14, wherein the characters in the source string are Unicode characters.

20. A code conversion system as recited in claim 14, wherein the characters in the target string are Unicode characters.

21. A computer readable medium containing program instructions for converting a source string into a target string, said computer readable medium comprising:
computer readable code configured to cause a computer to effect receiving a source string having a first character encoding;
computer readable code configured to cause a computer to effect dividing the source string into text elements, each text element including one or more characters of the source string, and at least one of the text elements including a plurality of characters of the source string;
computer readable code configured to cause a computer to effect obtaining attribute information for the text elements;
computer readable code configured to cause a computer to effect looking up in a conversion code associated with a second character encoding for each of the text elements, said computer readable code operates to effect looking up in the mapping table the conversion code associated with the second character encoding for each of the text elements by operating to select at least one of a plurality of mapping tables based on the attribute information and a length of the text element, and then looking up the conversion code from the selected one of the mapping tables; and computer readable code configured to cause a computer to effect combining the conversion codes for the text elements so as to form a target string of the second character encoding.

22. A method for converting a source string into a target string, said method comprising:
 (a) receiving a source string having a first character encoding;
 (b) sequentially dividing the source string into text elements, each text element including one or more characters of the source string, and at least one of the text elements including a plurality of characters of the source string;
 (c) obtaining attribute information for the text elements after or during said dividing (b)
 (d) looking up in a mapping table a conversion code associated with a second character encoding for each of the text elements, said looking up (d) in the mapping table of the conversion code for each of the text elements includes the operations of (d1) selecting one of a plurality of mapping tables based on the attribute information and a length of the text element, and (d2) looking up the conversion code from the selected one of the mapping tables; and
 (e) combining the conversion codes for the text elements so as to form a target string of the second character encoding.

23. A method as recited in claim 22, wherein said dividing (b) comprises:
 (b1) obtaining a next source character from the source string;
 (b2) determining whether the source character obtained should be included within a current text element or alternatively begin a new next text element;
 (b3) placing the source character obtained in the current text element or the new next text element in accordance with said determining (b2); and
 (b4) repeating (b1) through (b3) until the source string has been completely placed in text elements.

24. A method as recited in claim 23, wherein said determining (b2) comprises:
 (i) looking up the attribute information associated with the source character, the attribute information including at least a class indicator;
 (ii) providing a state machine having a plurality of states, the state machine being used to determining whether the source character obtained should be included within the current text element or alternatively begin a new next text element based on the class indicator and a current state of the state machine; and
 (iii) updating the current state of the state machine.

25. A method as recited in claim 24, wherein said method further comprises:
 (f) reordering, after said dividing (b) but prior to said look up (c), certain characters with each of the text elements if the certain characters are present in the text elements.

26. A code conversion system as recited in claim 14, wherein said mapping table includes more than one target encodings for certain text elements of the source encoding, and a particular one of the target encodings for the certain text elements is obtained by attributes determined for the certain text elements.

27. A code conversion system as recited in claim 14,
 wherein said code conversion system further comprises:
  a scanner table that stores scan information; and
  an attributes table that stores attribute information for the characters in the source string, and
 wherein said scanner operates to divide the source string into text elements in accordance with the scan information stored in said scanner table and attribute information stored in said attributes table.

28. A method as recited in claim 22,
 wherein said looking up (d) in the mapping table of the conversion code for each of the text elements further includes the operation of: (d3) identifying a requested variant prior to said selecting (d1), and
 wherein said selecting (d2) of one of the plurality of mapping tables is achieved based on the attribute information, the requested valiant, and the length of the text element.

29. A computer readable medium as recited in claim 21, wherein said computer readable code configured to cause a computer to effect looking up in a conversion code associated with a second character encoding further operates to effect the looking up by identifying a requested variant prior to the selection of the one of the mapping tables, and wherein the selection of one of the plurality of mapping tables is achieved based on the attribute information, the requested variant, and the length of the text element.

30. A computer readable medium as recited in claim 29, wherein said computer readable medium further comprises:
 computer readable code configured to cause a computer to effect reordering certain characters with each of the text elements if the certain characters are not in a canonical order.

31. A computer readable medium as recited in claim 21, wherein the attribute information obtained includes at least any two of direction, class, priority, subset, context, or symmetric swapping state.

* * * * *